United States Patent
Kellerman

(10) Patent No.: US 6,945,813 B1
(45) Date of Patent: Sep. 20, 2005

(54) SOCKET ASSEMBLY FOR ELECTRIC METER BOX

(75) Inventor: Dallas Wayne Kellerman, Belleville, IL (US)

(73) Assignee: Cooper Technologies Company, Houston, TX (US)

(*) Notice: Subject to any disclaimer, the term of this patent is extended or adjusted under 35 U.S.C. 154(b) by 71 days.

(21) Appl. No.: 10/796,768

(22) Filed: Mar. 9, 2004

(51) Int. Cl.[7] .............................................. H01R 33/945
(52) U.S. Cl. ....................... 439/517; 439/508; 439/638
(58) Field of Search ................................ 439/517, 508, 439/167, 146, 638; 361/662, 667, 669, 741

(56) References Cited

U.S. PATENT DOCUMENTS

| | | |
|---|---|---|
| 1,551,568 A | 9/1925 | Johnson |
| 2,088,480 A | 7/1937 | Mylius |
| 2,146,628 A | 2/1939 | Jackson |
| RE21,148 E | 7/1939 | Mylius |
| 2,184,840 A | 12/1939 | Johansson et al. |
| 2,231,737 A | 2/1941 | Rutter |
| 2,371,446 A | 3/1945 | Jensen |
| 2,454,760 A | 11/1948 | Anderson |
| 2,838,626 A | 6/1958 | Kuhn |
| 3,003,085 A | 10/1961 | Rund |
| 3,027,440 A | 3/1962 | Daly |
| 3,029,322 A | 4/1962 | Waldrop |
| 3,131,984 A | 5/1964 | Kobryner |
| 3,164,751 A | 1/1965 | Lewis |
| 3,263,130 A | 7/1966 | Duvall |
| 3,281,550 A | 10/1966 | Waldrop |
| 3,289,150 A | 11/1966 | Sturdivan |
| 3,368,118 A | 2/1968 | Orr |
| 3,375,409 A | 3/1968 | Sturdivan |
| 3,423,723 A | 1/1969 | Kobryner |
| 3,657,683 A | 4/1972 | Grieshaber |

(Continued)

FOREIGN PATENT DOCUMENTS

JP 9103009 4/1997

OTHER PUBLICATIONS

Milbank Online Catalog, "Meter Mounting Equipment: Heavy Duty Lever Bypass", not dated, 3 pages (see reference 44 for photographs of a Power Line Connector of a Milbank Heavy Duty Lever Bypass Meter Socket).
Photographs of a Power Line Connector of a Milbank Heavy Duty Lever Bypass (as shown in reference 43), not dated, 5 pages.

Primary Examiner—Hien Vu
(74) Attorney, Agent, or Firm—Senniger Powers

(57) ABSTRACT

This invention relates to a socket assembly for a meter box. The socket assembly comprises a plurality of power line connectors for connection to electric power lines of an electric power line system and a meter bypass system. Each power line connector comprises a jaw, a jaw support and first and second sockets. The jaw support comprises a base, a jaw mount having spaced apart flanges and a contact arm. The base, jaw mount and contact arm are formed as a one-piece metal structure to provide a joint-free path for flow of electrical current. The first socket is formed between the jaw and jaw mount for receiving an electrical connector of the electric meter. The second socket is formed between the jaw and contact arm for receiving a slide connector of a bypass system. The slide connector is slidable between a meter operating position and a meter bypass position.

28 Claims, 29 Drawing Sheets

U.S. PATENT DOCUMENTS

| | | |
|---|---|---|
| 3,678,237 A | 7/1972 | Rickert et al. |
| 3,744,010 A | 7/1973 | Meacham |
| 3,764,956 A | 10/1973 | Norden |
| 3,869,188 A | 3/1975 | Morrison et al. |
| 3,880,494 A | 4/1975 | Reed et al. |
| 3,914,564 A | 10/1975 | Reed et al. |
| 3,962,610 A | 6/1976 | Reed et al. |
| 4,117,530 A | 9/1978 | Reed et al. |
| 4,201,439 A | 5/1980 | M'Sadoques |
| 4,203,146 A | 5/1980 | Sabatella et al. |
| 4,388,670 A | 6/1983 | Billhartz |
| 4,404,521 A | 9/1983 | Fennell |
| 4,525,023 A | 6/1985 | Lawson |
| 4,621,303 A | 11/1986 | Rowe |
| 4,690,483 A | 9/1987 | Carris |
| 4,944,692 A | 7/1990 | Allina |
| 5,334,057 A | 8/1994 | Blackwell |
| 5,385,486 A | 1/1995 | Robinson et al. |
| 5,423,695 A | 6/1995 | Robinson et al. |
| 5,546,269 A | 8/1996 | Robinson et al. |
| 5,571,031 A | 11/1996 | Robinson et al. |
| 5,572,396 A | 11/1996 | Robinson |
| 5,577,933 A | 11/1996 | Robinson et al. |
| 5,588,874 A | 12/1996 | Pruehs et al. |
| 5,620,337 A | 4/1997 | Pruehs |
| 5,657,200 A | 8/1997 | Leach et al. |
| 5,762,522 A | 6/1998 | Robinson et al. |
| 5,775,942 A | 7/1998 | Jeffcoat |
| 5,835,300 A | 11/1998 | Murphy et al. |
| 5,853,300 A | 12/1998 | Robinson et al. |
| 5,870,276 A | 2/1999 | Leach et al. |
| 5,980,311 A | 11/1999 | Campbell et al. |
| 5,997,347 A | 12/1999 | Robinson et al. |
| 6,012,937 A | 1/2000 | Campbell et al. |
| 6,059,605 A | 5/2000 | Robinson et al. |
| 6,104,586 A | 8/2000 | Robinson |
| 6,152,764 A | 11/2000 | Robinson et al. |
| 6,361,340 B1 | 3/2002 | Robbins et al. |
| 6,488,535 B1 | 12/2002 | Robinson et al. |
| 6,565,394 B2 | 5/2003 | Seff et al. |
| 6,592,399 B2 | 7/2003 | Robinson et al. |
| 6,663,422 B1 | 12/2003 | Robinson et al. |
| 2002/0034893 A1 | 3/2002 | Robinson et al. |

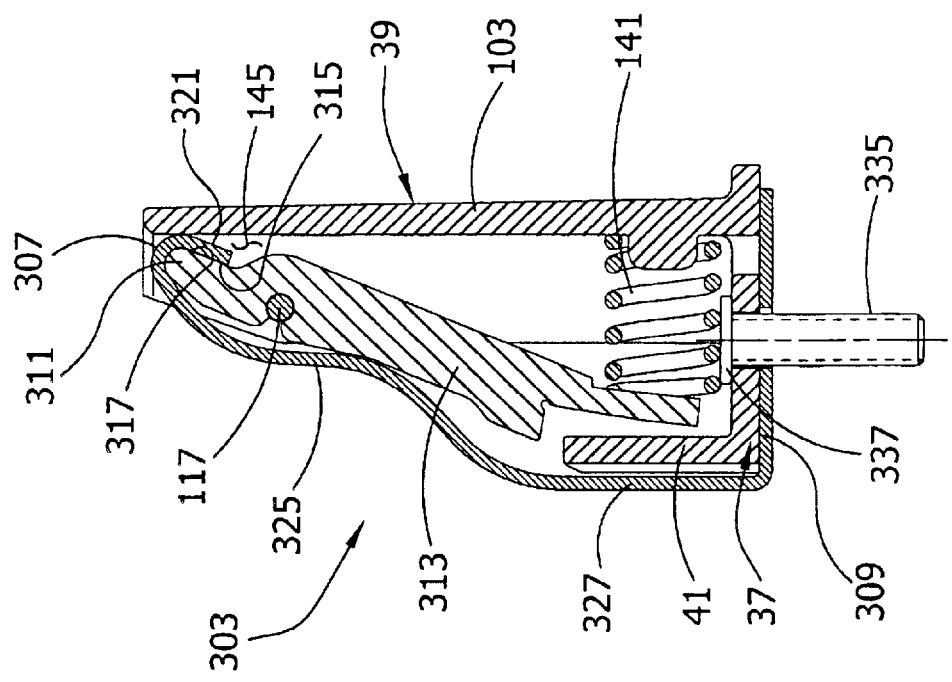
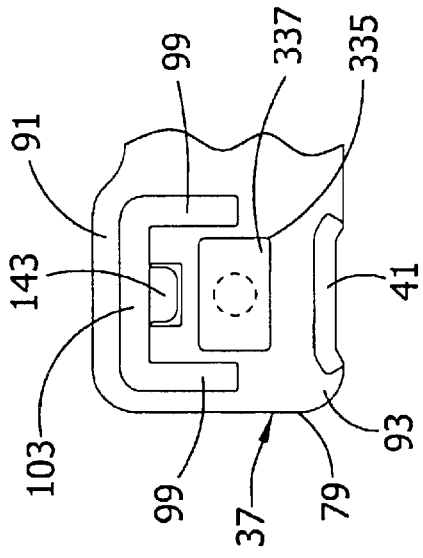
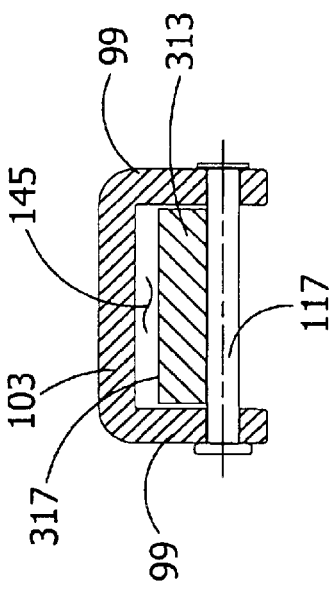

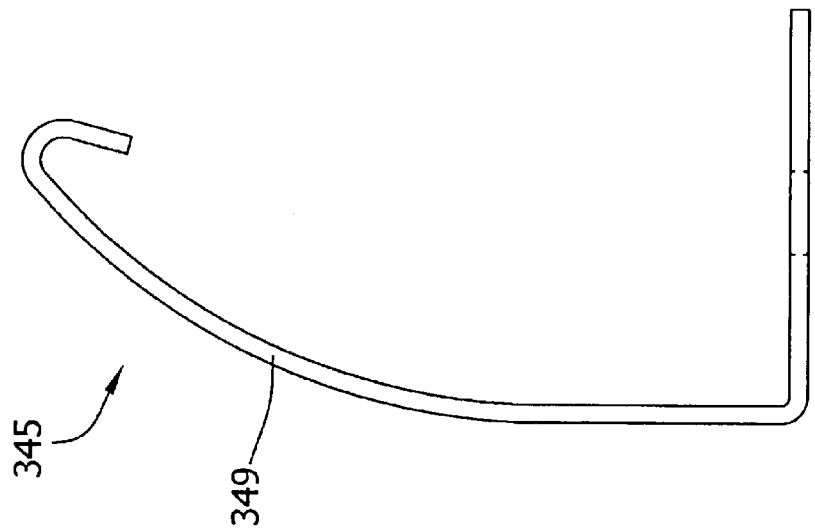
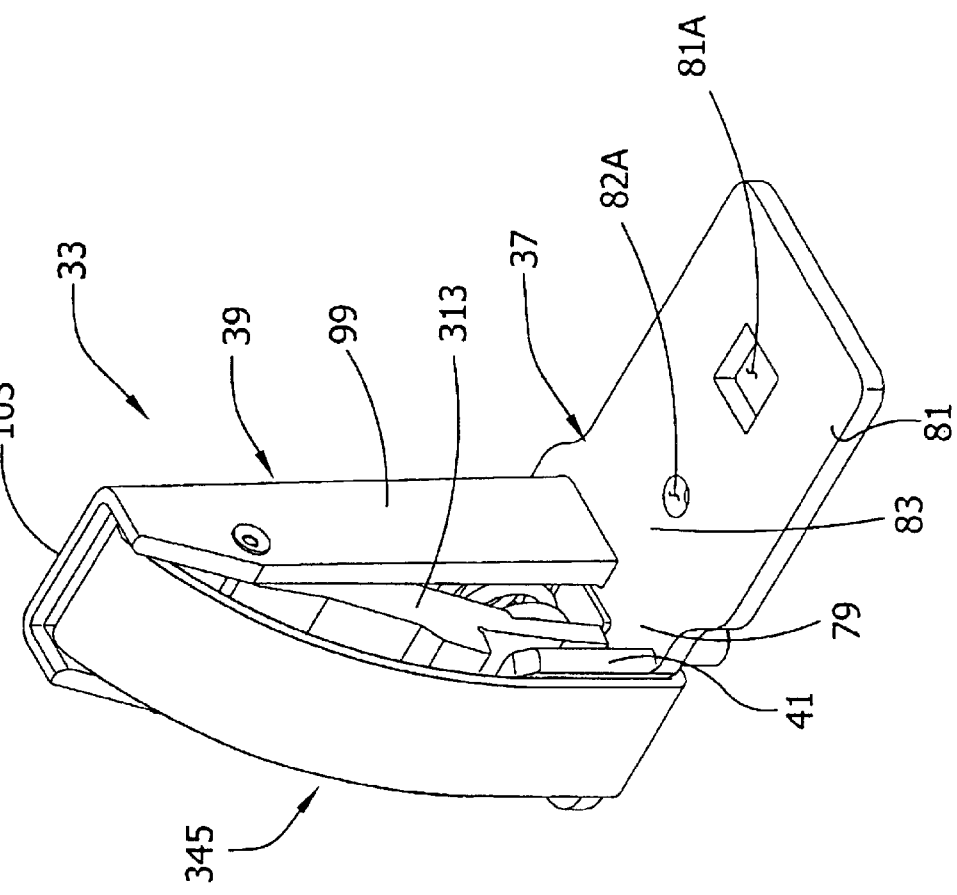

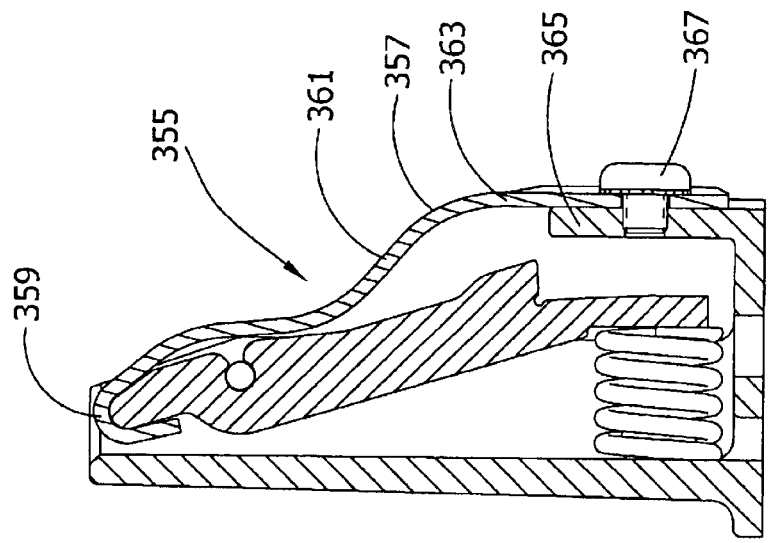
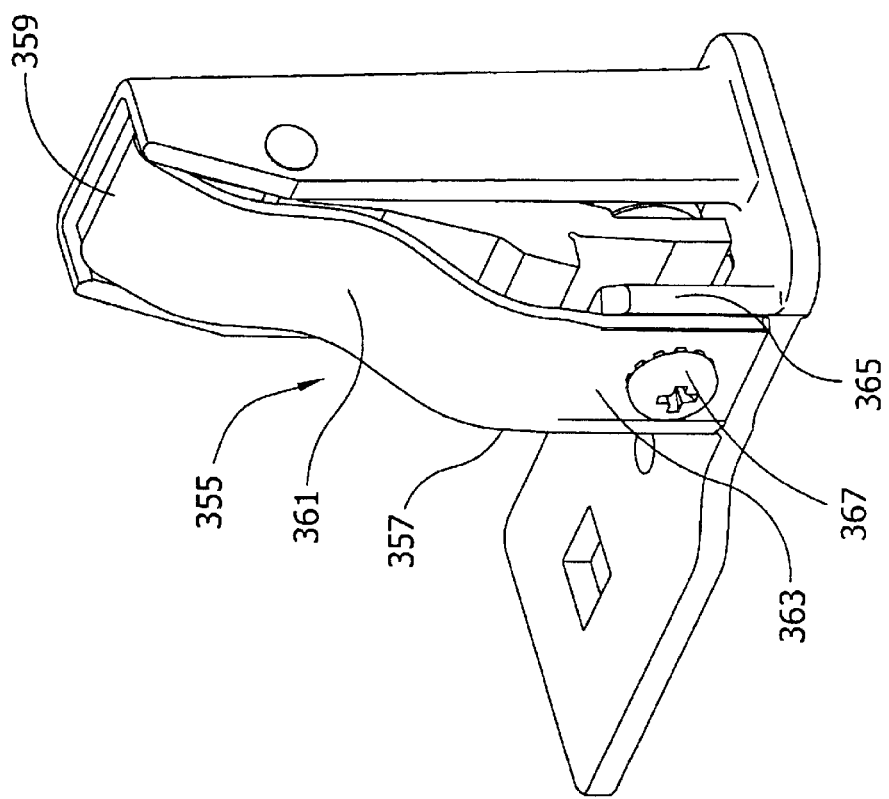

SOCKET ASSEMBLY FOR ELECTRIC METER BOX

BACKGROUND OF THE INVENTION

This invention relates generally to electrical components used in a meter box containing an electrical meter, and more particularly to a socket assembly and related features used in a such an assembly.

In conventional meter boxes, an electric meter is plugged into a socket assembly mounted in the box. In a single-phase, 3-wire power system, for example, the socket assembly typically includes two power line connectors for connecting the power supply lines to the socket assembly, two power line connectors for connecting the power load lines to the socket assembly, and a meter bypass system. During normal operation, electrical current flows from the power supply lines, through the meter, to the power load lines. During meter repair or replacement, the bypass system is used to route the current along a path bypassing the meter so that the meter can be removed for repair or replacement without interrupting power to the installation (e.g., residence) being serviced.

In one type of conventional bypass system a slide connector is mounted for sliding movement along a linear line of action between a meter-bypass position in which the slide connector is in electrical contact with a first power line connector connected to the power supply line and a second power line connector connected to the power load line, and a non-bypass position in which the slide connector is out of electrical contact with one of the two power line connectors. Each power line connector comprises a metal jaw support, a jaw pivotally mounted on the jaw support, and a spring to bias rotation of the jaw. Notably, the jaw support is constructed of two separate metal pieces joined together at joints by being swaged, riveted or brazed together in an assembly process. The upper ends of the jaw supports and the opposing upper ends of the jaws define a pair of sockets for receiving the plugs of an electric meter. When the bypass system is its non-bypass (meter conducting) mode, current flows from the power supply line to the power load line along a path which includes the meter and the two-piece metal jaw supports of the power line connectors. Accordingly, current must flow through the joints in the metal jaw supports.

Running current through the joints in the jaw supports has several disadvantages. First, the conductivity through the joints is generally less than what the conductivity would be through a one-piece jaw support. Second, the joints may not be properly formed due to errors in the assembly process, thereby further reducing the conductivity of the jaw support. The reduced conductivity can cause heat buildup which can lead to eventual failure of the product.

Moreover, the joints in the jaw supports adversely affect the structural strength of the socket assembly. The socket assembly has to be strong enough to withstand the forces involved in moving a slide connector between its non-bypass position and its bypass position. Because actuation of the slide connector involves forcibly wedging cam-shaped ends of the slide connector into contact with respective jaw supports, thereby causing the jaws of the supports to rotate against the resilient bias of the springs, the socket assembly has to be able to withstand considerable lateral forces. The reduced structural strength resulting from multiple joints, especially in combination with potential weakening of the material strength caused by excessive heat buildup, can contribute to premature failure of the system.

U.S. Pat. No. 5,775,942 issued Jul. 7, 1998 to Jeffcoat discloses a jaw support made out of one piece of metal. However, the jaw support is designed to operate in a different type of bypass system, i.e., one where a lever arm rotates a knife blade connector into contact with the jaw supports. The rotating connector design shown in the Jeffcoat system cannot be used in a bypass system which uses a linear-slide connector because of the different configurations involved. Further, the connector subassemblies in the Jeffcoat System are designed to have structural strength in a direction to accommodate a rotating connector, not a linear-slide connector.

Also, in prior socket assemblies using conventional power line connectors, substantially all electrical current passes through the jaw supports when the meter is plugged into the socket assembly and the bypass system is in its non-bypass mode. This can result in overheating of the jaw supports and possible premature failure.

There is a need, therefore, for an improved socket assembly which avoids one or more of the aforementioned problems.

SUMMARY OF THE INVENTION

In general, this invention relates to a socket assembly for a meter box. The socket assembly comprises a plurality of power line connectors for connection to electric power lines of an electric power line system and a meter bypass system. The electric power line system includes at least a first power supply line and at least a first power load line. The power line connectors are adapted to mate with mating connectors of an electric meter to establish a first current path from the first power supply line to the first power load line through the electric meter. The meter bypass system establishes a second current path from the first power supply line to the first power load line bypassing the electric meter to permit removal of the meter without interruption of electric service. The bypass system comprises at least one slide connector comprising a metal conductor mounted for back and forth sliding movement of the conductor along a line of action extending between first and second power line connectors. Each of the first and second power line connectors comprise a jaw, a jaw support, a first socket and a second socket. The jaw support comprises a base, a jaw mount extending up from the base and a contact arm extending up from the base. The jaw mount has opposing spaced apart flanges with lower ends connected to the base. The opposing flanges mount the jaw therebetween for pivotal movement between open and closed positions. A web spans and integrally connects at least a portion of the first and second flanges and integrally connects the jaw mount to the base. The contact arm has an inner contact surface generally opposing the web of the jaw mount. The base, jaw mount and contact arm are formed as a one-piece structure to provide a joint-free path for flow of electric current. The first socket is formed between the jaw and the jaw mount for receiving a respective electrical connector of the electric meter. The second socket is formed between the jaw and the contact arm for electrical connection with the conductor on the slide connector. The slide connector is slidable between a meter operating position and a meter bypassing position. When the slide connector is in the meter operating position, the metal conductor is out of electrical contact with at least one of the second sockets of the first and second power line connectors whereby current is adapted to flow along the first current path through the electric meter when the electrical connectors of the electric meter are in the first sockets of the first and second power line connectors. When the slide connector is in the meter bypassing position, the metal conductor of the slide connector is in electrical contact with the second sockets of both of the first and second power line connectors whereby current is adapted to flow along a second current path from the power supply line to the power load line when the electrical connectors of the electric meter are removed from the first sockets of the first and second power line connectors.

In another aspect, this invention relates to a power line connector for use in a socket assembly in a meter box. The power line connector comprises a jaw, a jaw support comprising a base and a jaw mount, a first socket and a second socket. The jaw mount extends up from the base and has opposing spaced apart flanges with lower ends connected to the base. The opposing flanges mount the jaw therebetween for pivotal movement between open and closed positions. A web spans and integrally connects at least a portion of the first and second flanges and integrally connects the jaw mount to the base. A contact arm extends upward from the base and has an inner contact surface generally opposing the web of the jaw mount. The base, jaw mount and contact arm are formed as a one-piece metal structure to provide a joint-free path for flow of electrical current. The first socket is formed between the jaw and the jaw mount for receiving a mating electrical connector of an electric meter. The second socket is formed between the jaw and the contact arm for receiving a slide connector of a bypass system mounted in the meter box for back and forth sliding movement along a line of action generally parallel to the base of the jaw support.

Other features of the present invention will be in part apparent and in part pointed out hereinafter.

BRIEF DESCRIPTION OF THE DRAWINGS

FIG. 21 is a vertical section of the assembled power line connector of FIG. 20;

FIG. 22 is a view showing the head of a T-bolt positioned between flanges of a jaw mount of the power line connector of FIG. 20;

FIG. 23 is a horizontal section showing a jaw pivotally mounted on the jaw mount of FIG. 20;

FIG. 24 is a perspective of a power line connector of another embodiment incorporating a different version of a current diverter of this invention; and FIG. 25 is a side elevation of the current diverter of FIG. 24;

FIG. 26 is a perspective of a power line connector of another embodiment incorporating a different version of a current diverter and a different means of fastening the current diverter to a contact arm;

FIG. 27 is a vertical section of the power line connector of FIG. 26;

Corresponding parts are designated by corresponding reference numbers throughout the drawings.

DETAILED DESCRIPTION OF THE PREFERRED EMBODIMENT

Figure 1:
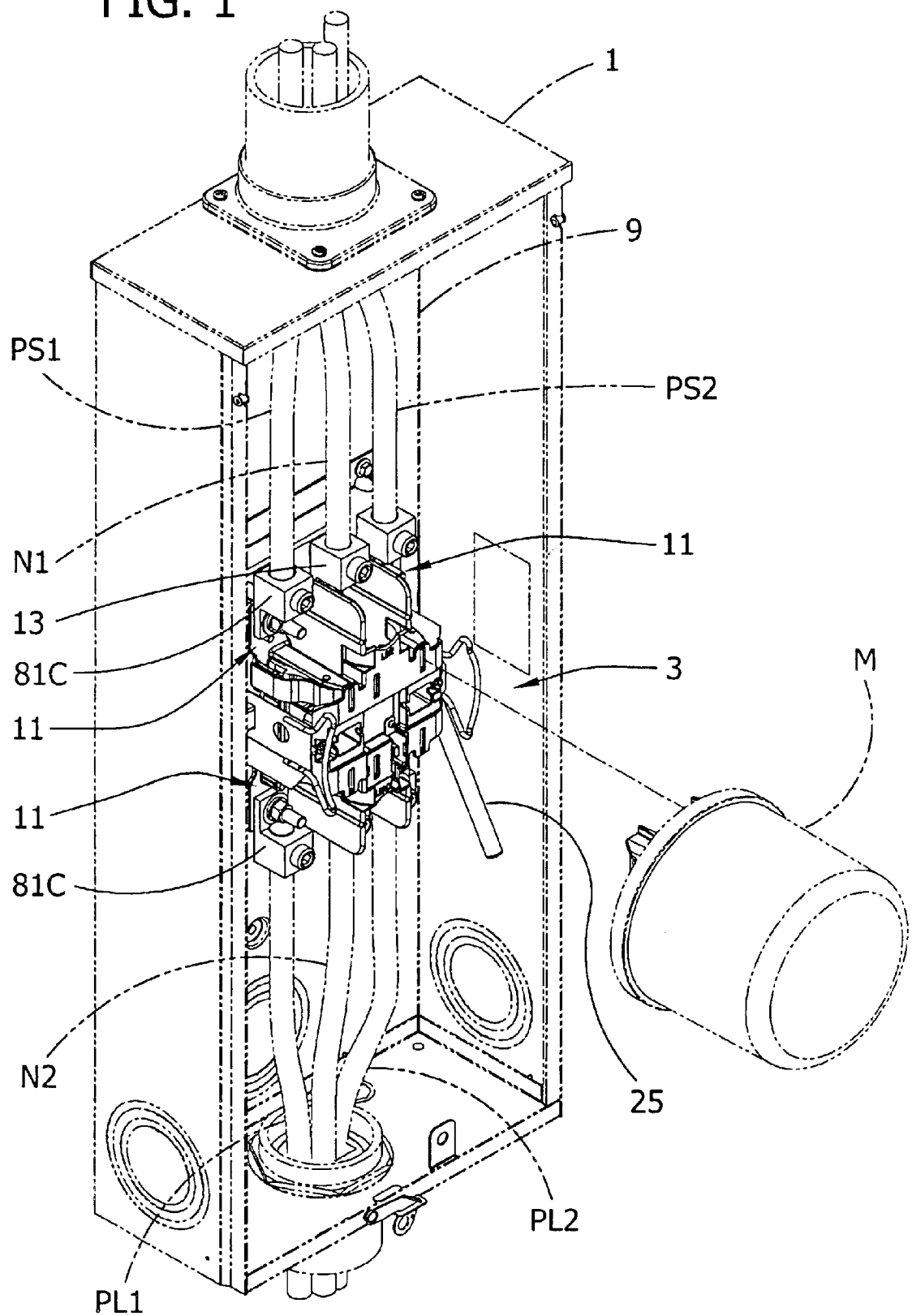
FIG. 1 is a front perspective of a meter box having a meter socket assembly of this invention installed therein, an electric meter being shown exploded away and removed from the socket assembly.

Referring now to the drawings, FIG. 1 illustrates a conventional enclosure 1, sometimes referred to as a meter box, for housing an electric meter M (shown in phantom), the cover of the meter box being removed to show components within the box. A meter socket assembly, generally designated 3, is mounted in the meter box 1 and comprises a support 7 (FIG. 2) which is adapted to be fastened to the back wall 9 of the box. The socket assembly also includes a plurality of power line connectors, each generally designated 11, secured to the support 7 for connection to the electric power lines (conductors) of a power line system. The installation shown in FIG. 1 is a 320 amp, single-phase, 3-wire power system found in many light commercial applications. The power system includes two power supply lines PS1, PS2 connected to two corresponding power line connectors 11 for transmitting power from a suitable power supply, two power load lines PL1, PL2 connected to two corresponding power line connectors 11 for transmitting power to the facility being served, and two neutral lines N1, N2 connected to conventional neutral line connectors 13 (only one of which is shown in FIG. 1). As will be described, the power line connectors 11 are configured to mate with mating connectors 15 (FIG. 5) of the electric meter M to establish a first current path from each power supply line to a respective power load line through the electric meter. The number of power line connectors 11 used in the socket assembly 3 will vary depending on the power system. For example, in a 320 amp, 3-phase, 4-wire system, the socket assembly would include 6 power line connectors 11.

Figure 2:
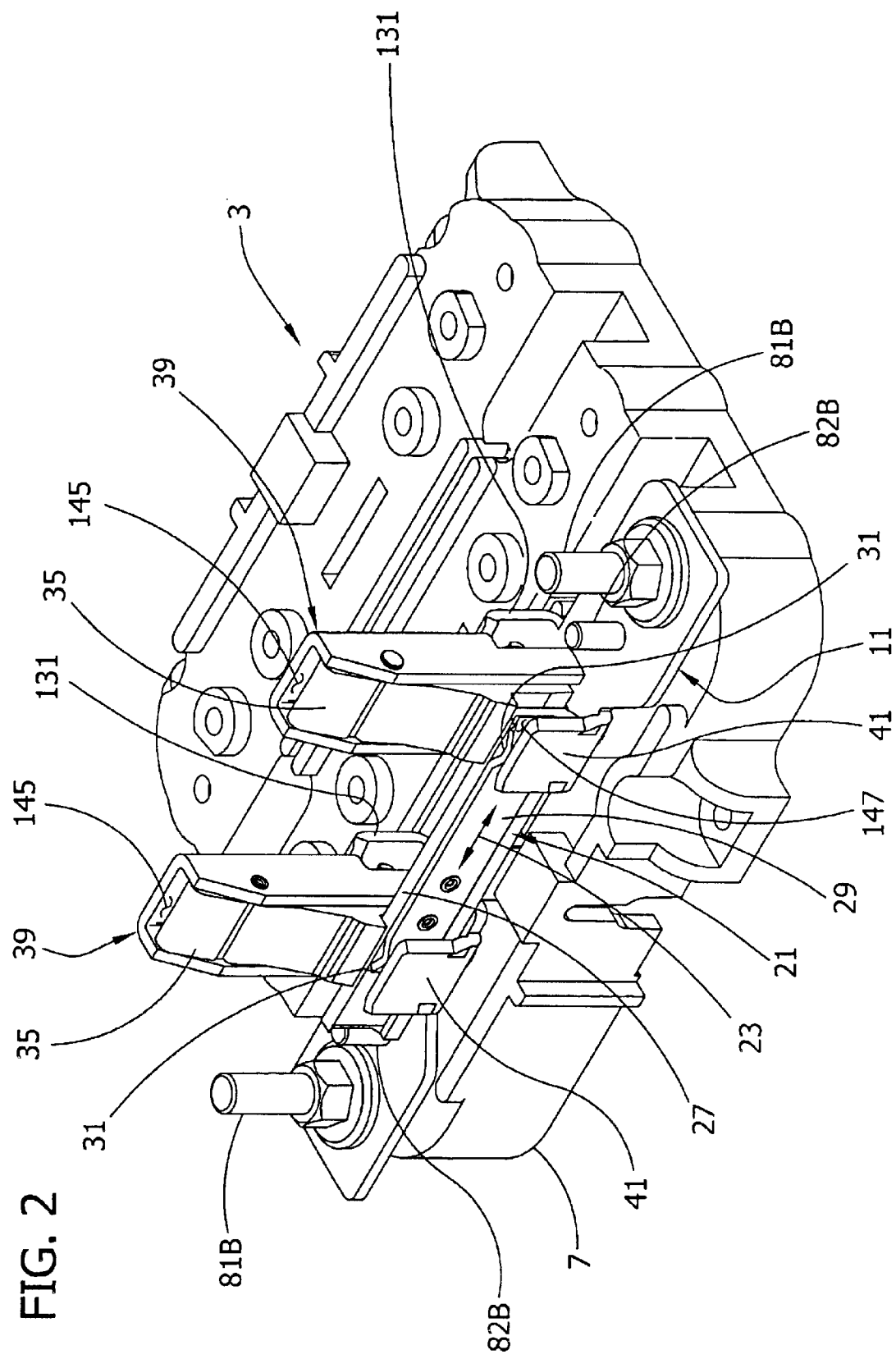
FIG. 2 is an enlarged portion of FIG. 1 with parts of the socket assembly removed to show details of a bypass system, the bypass system being illustrated in its bypass mode.
Figure 3:
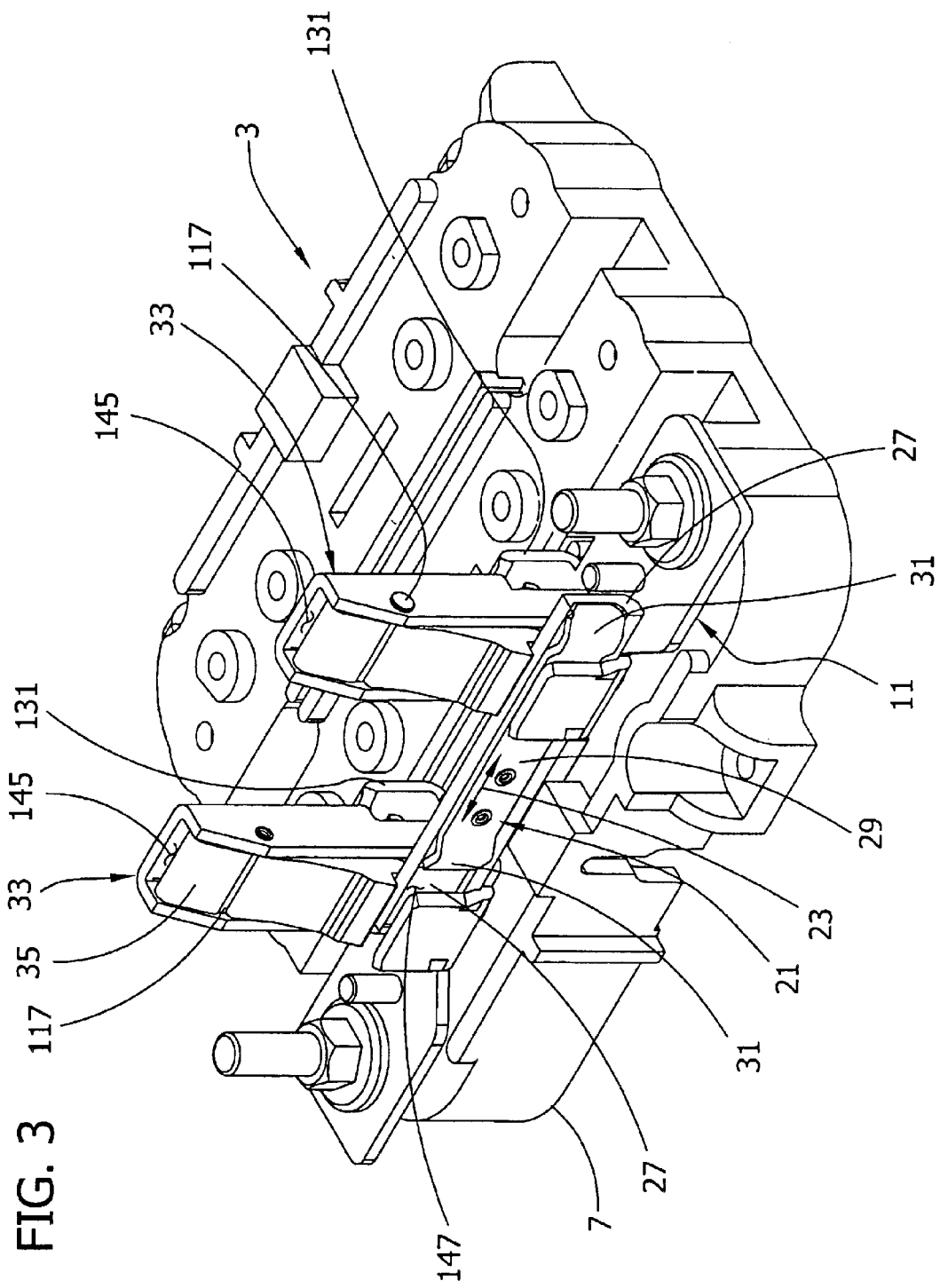
FIG. 3 is a view similar to FIG. 2 showing the bypass system in non-bypass mode.

Referring to FIGS. 2 and 3, the socket assembly 3 includes a meter bypass system for establishing a second separate current path from each power supply line PS1, PS2 to a respective power load line PL1, PL2 bypassing the electric meter M to permit removal of the meter without interruption of electric service. The bypass system comprises a slide connector, generally designated 21, for each power supply line and its respective load line, only one of the slide connectors being shown in FIGS. 2 and 3. Each slide connector 21 is mounted on the support 7 between two respective power line connectors 11 for back and forth linear sliding movement between a bypass position (FIG. 2) and a non-bypass position (FIG. 3). The linear sliding movement is in a direction generally parallel to the support 7 and the back wall 9 of the meter box 1 along a line of action indicated at 23. As will be described, each power line connector 11 is configured for selective mating electrical contact with a respective end of the slide connector 21. Movement of the slide connectors 21 between their bypass and non-bypass positions is effected by means of a pivot lever 25 (FIG. 1) and a conventional cam mechanism (not shown) connecting the lever and the slide connectors 21 for translating the pivotal movement of the lever to a linear action for moving the slide connectors between their respective bypass and non-bypass positions.

The slide connectors 21 are preferably of standard construction and will not be described in detail, other than to say that, in the embodiment shown, each comprises an elongate base 27 of dielectric material and a shorter generally flat metal conduction strip 29 affixed to the base. The metal conduction strip has cams 31 at its ends engagable with the power line connectors in a manner to be described in detail later.

The power line connectors 11 are substantially identical in the preferred embodiment so a description of one connector will suffice. Referring to FIG. 6, the connector 11 comprises a metal jaw support generally designated 33 which supports a jaw 35 for pivotal movement between open and closed positions. The jaw support 33 is formed as a one-piece metal structure comprising a base 37, a jaw mount generally indicated at 39 extending up from the base, and a contact arm 41 on the base opposing the jaw mount which provides a joint-free path for the flow of electrical current, as will be described hereinafter. In accordance with one embodiment of this invention (FIGS. 5–10), the jaw support 33 is formed by appropriately bending a single piece of sheet metal (e.g., 0.125 in. thick steel or copper).

Figure 4:
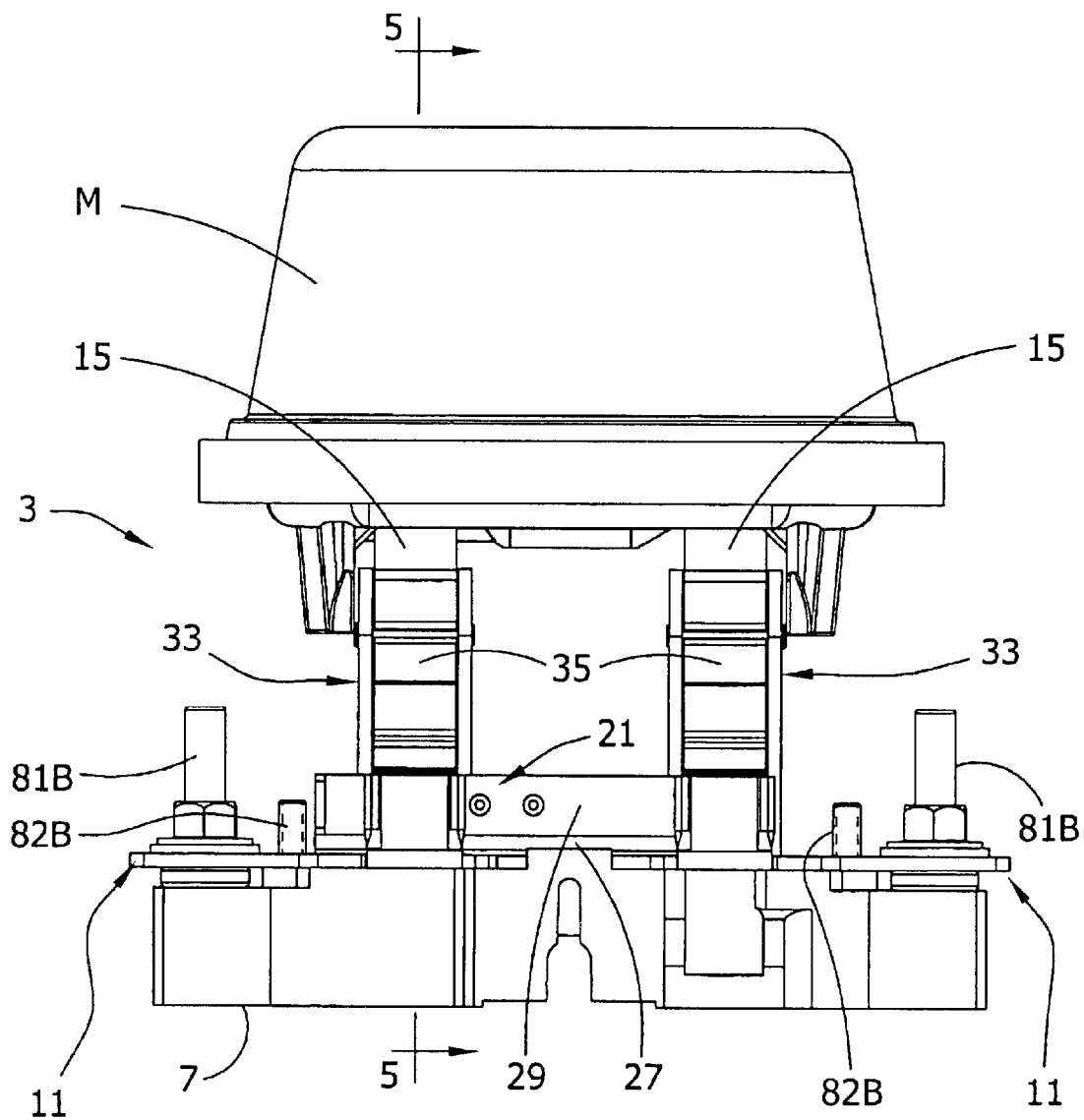
FIG. 4 is a side elevation of the socket assembly showing the electric meter plugged into the assembly.
Figure 6:
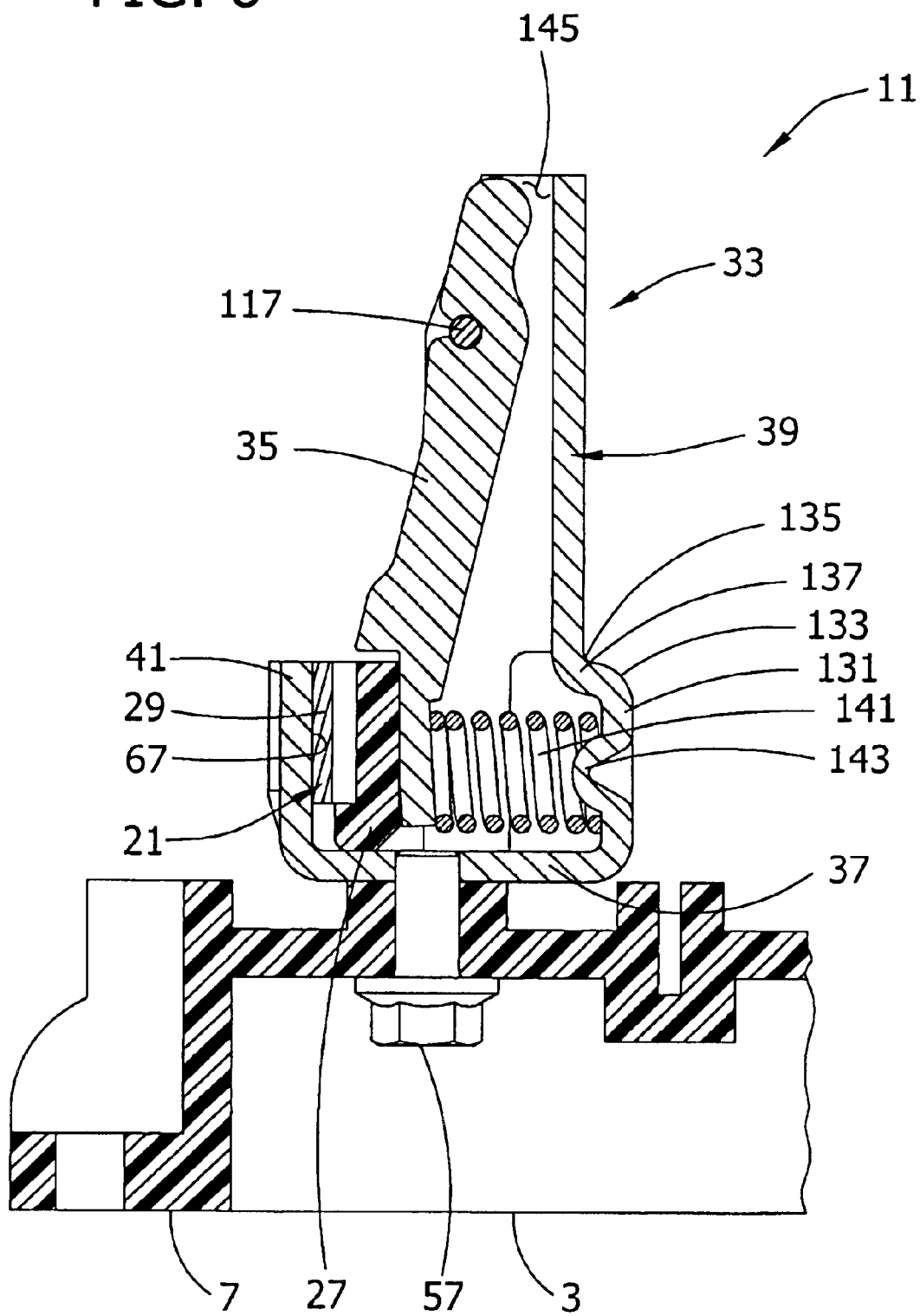
FIG. 6 is a view similar to FIG. 5 but with the meter removed from the socket assembly.
Figure 7:
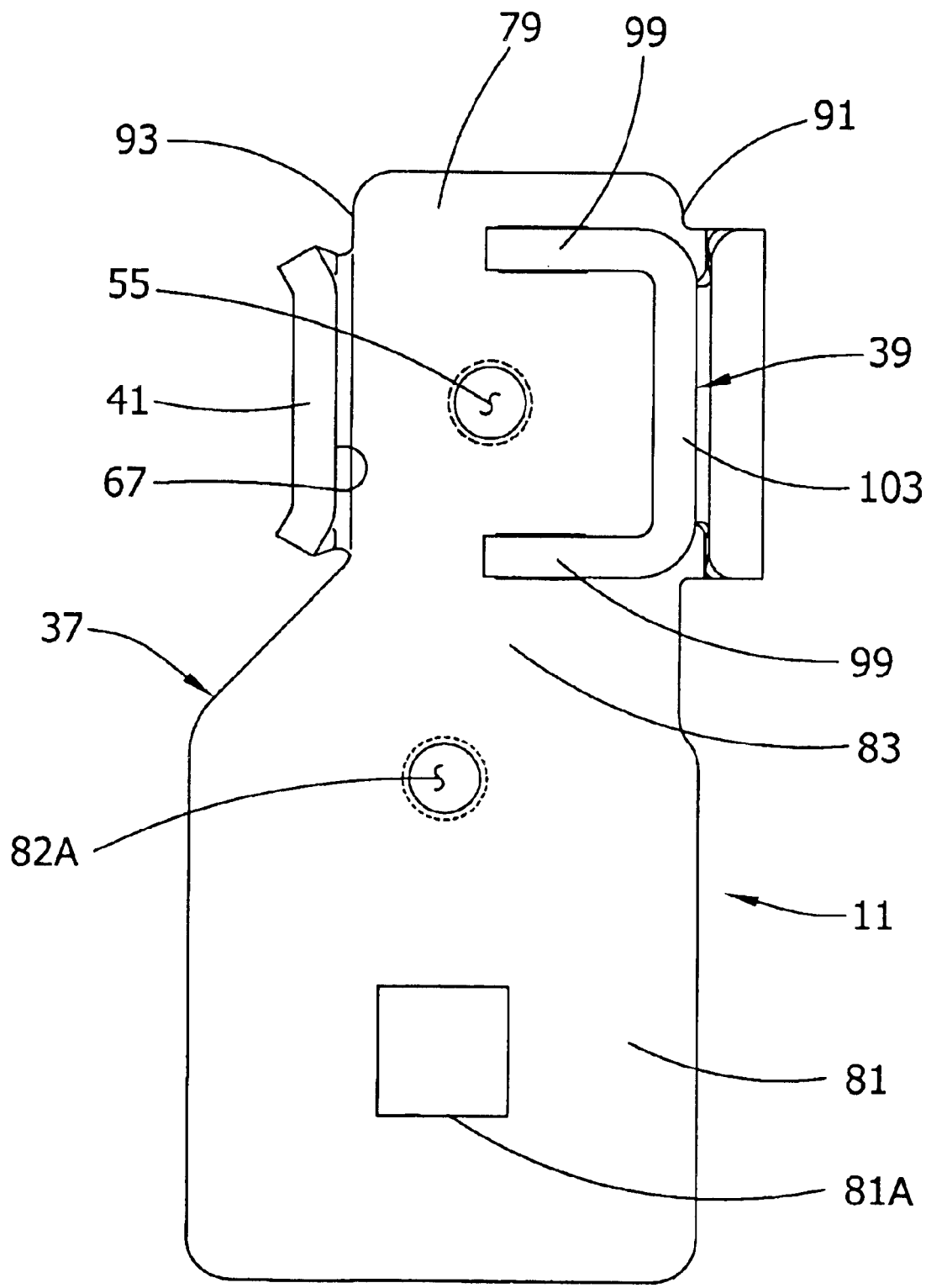
FIG. 7 is a top plan of a jaw support of the power line connector of FIG. 6.
Figure 8:
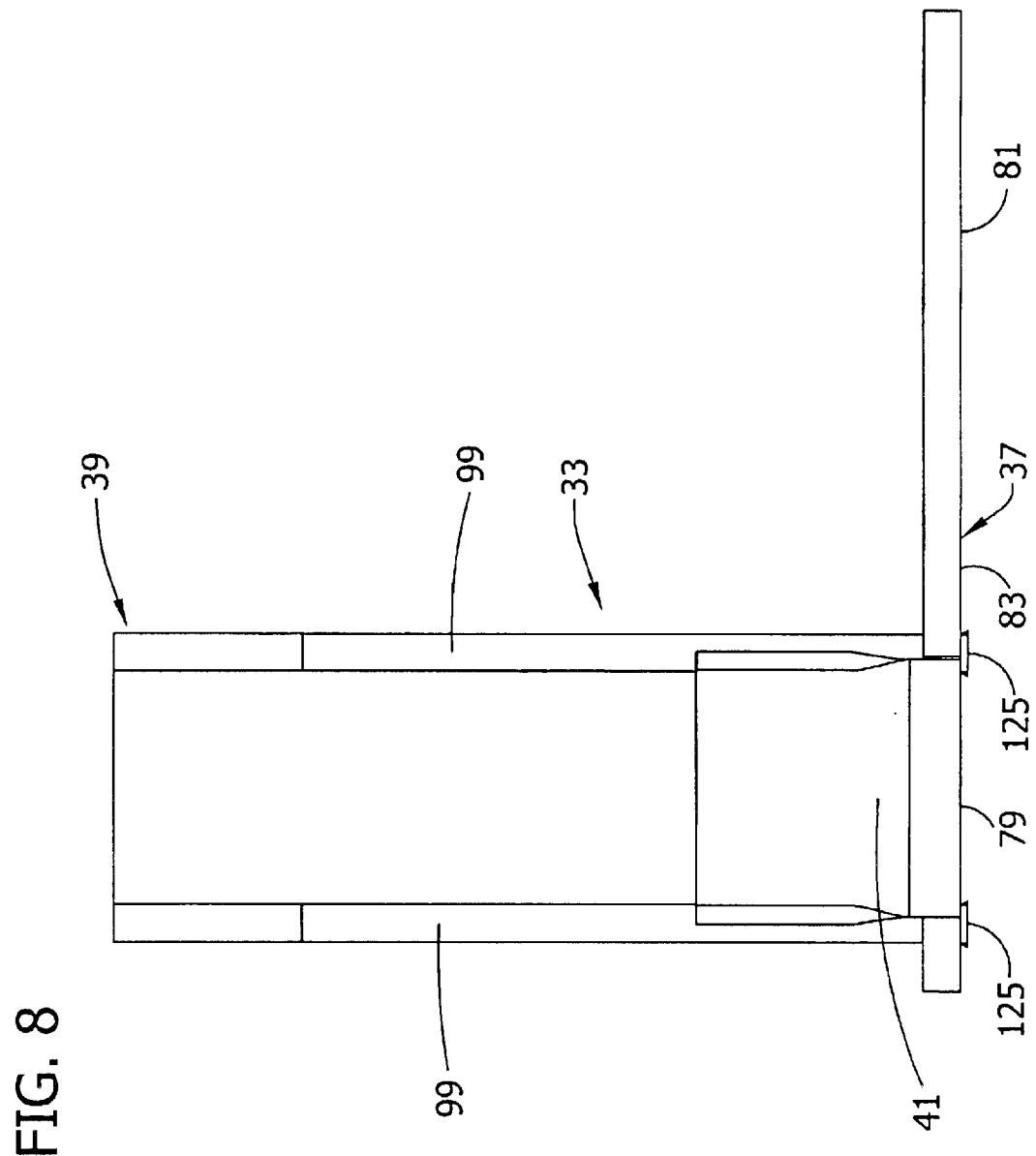
FIG. 8 is a front elevation of the jaw support of FIG. 7.

In the embodiment shown in FIG. 7, the base 37 comprises a generally square planar first end region 79 with a hole 55 through the center to mount the jaw support 33 on the meter base 7 by conventional means (e.g., fastener 57 in FIG. 6). The base has a second generally rectangular planar end region 81 with an opening 81A for receiving a fastener 81B (FIGS. 2 and 4) to secure a conventional power line fitting 81C (FIG. 1) to the base. A second opening 82A is also provided for receiving a pin 82B (FIGS. 2 and 4) used to secure a plate component (not shown) to the base in an installation of 320 amps or more. A middle region 83 of the base connects the first and second end regions 79, 81. In the embodiment shown in FIG. 7, the end and middle regions 79, 81, 83 of the base are generally co-planar, and the middle region 83 is narrower than the first and second end regions 79, 81. However, other configurations are possible. For example, the end region 81 may be curved to have a part-cylindric shape.

Referring again to FIGS. 7–11, the first end region 79 of the base has a first side 91 to which the jaw mount 39 is integrally attached and a second side 93 opposite the first side 91 to which the contact arm 41 is integrally attached. The contact arm 41 of the embodiment shown in FIGS. 7–11 extends upward from the second side 93 of the base and has an inner generally planar contact surface 67 facing the jaw mount 39 and substantially parallel to the line of action 25 of the slide connector. The contact arm 41 is also spaced an appropriate distance away from the line of action 25 of the slide connector 21 and extends upwardly a sufficient height to situate the contact surface 67 of the contact arm 41 adjacent to the line of action.

In one embodiment, the jaw mount 39 extends up from side 91 of the first end region 79 of the base and is configured as a three-sided channel with the open side of the channel facing the contact arm 41 on the base. The jaw mount 39 has first and second opposing flanges 99 forming the sides of the channel and a web 103 which forms the back of the channel. The lower ends of the flanges 99 are formed with tabs 125 which are received in rectangular openings 127 in the base 37 and secured in place by means of stake connections, for example. The web 103 of the jaw mount 41 spans and integrally connects at least portions of the opposing flanges 99. For example, in the embodiment shown in FIG. 9, the web 103 integrally connects the flanges 99 from the top of the jaw mount 39 down about two thirds of the distance to the base 37. The lower end of the web 103 is integrally connected to side 91 of the base 37.

Figure 9:
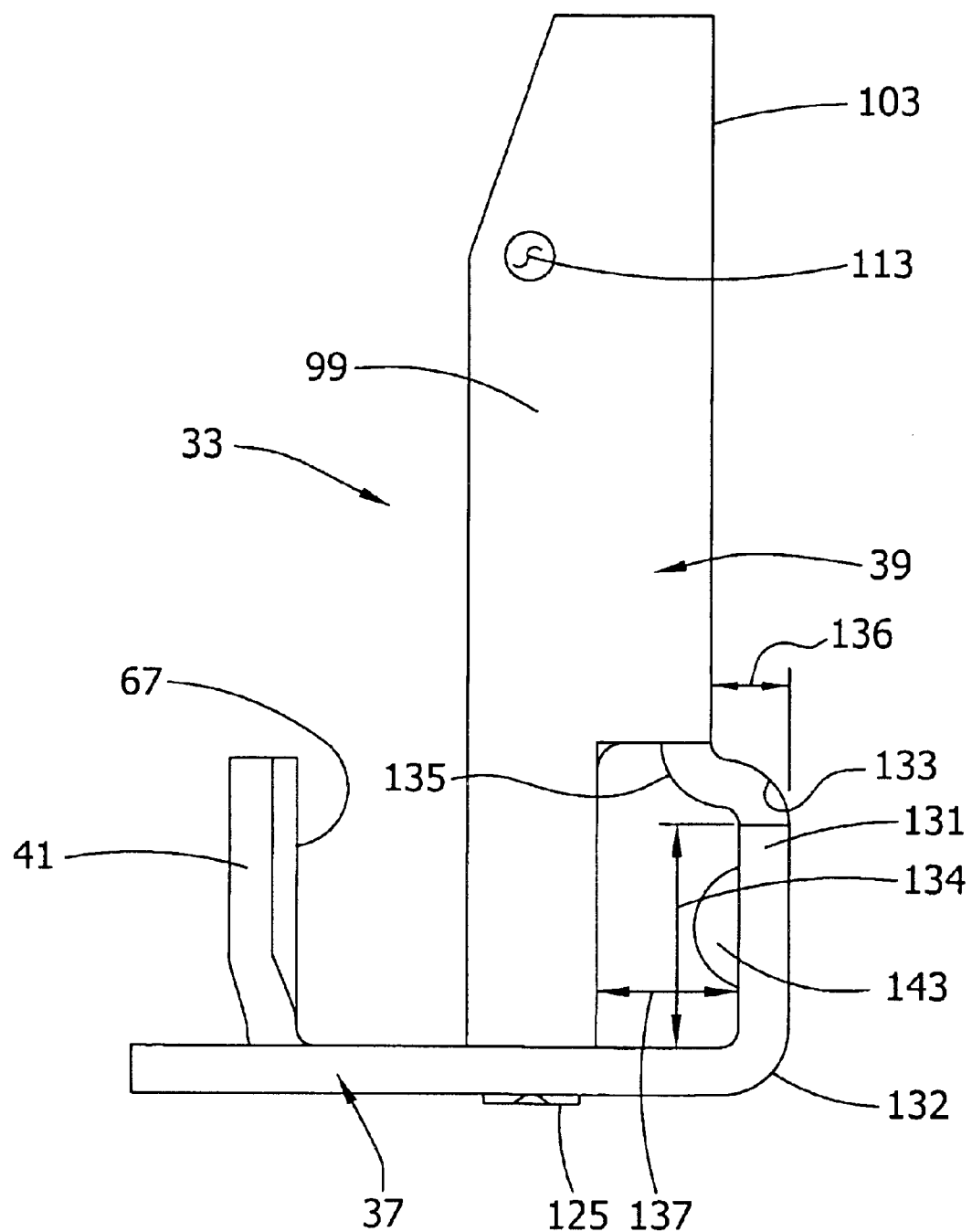
FIG. 9 is a side elevation of the jaw support of FIG. 7.
Figure 10:
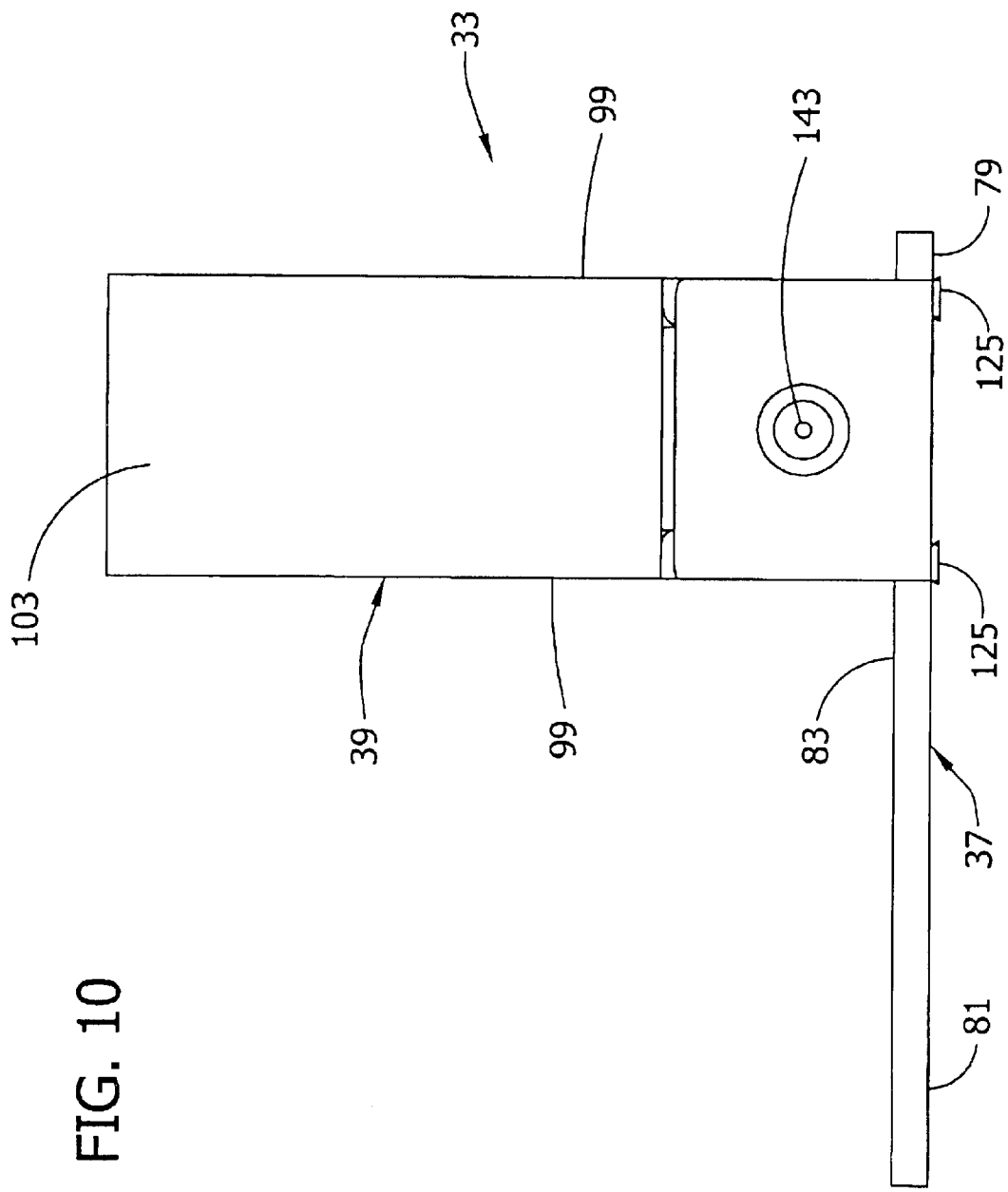
FIG. 10 is a rear elevation of the jaw support of FIG. 7.
Figure 11:
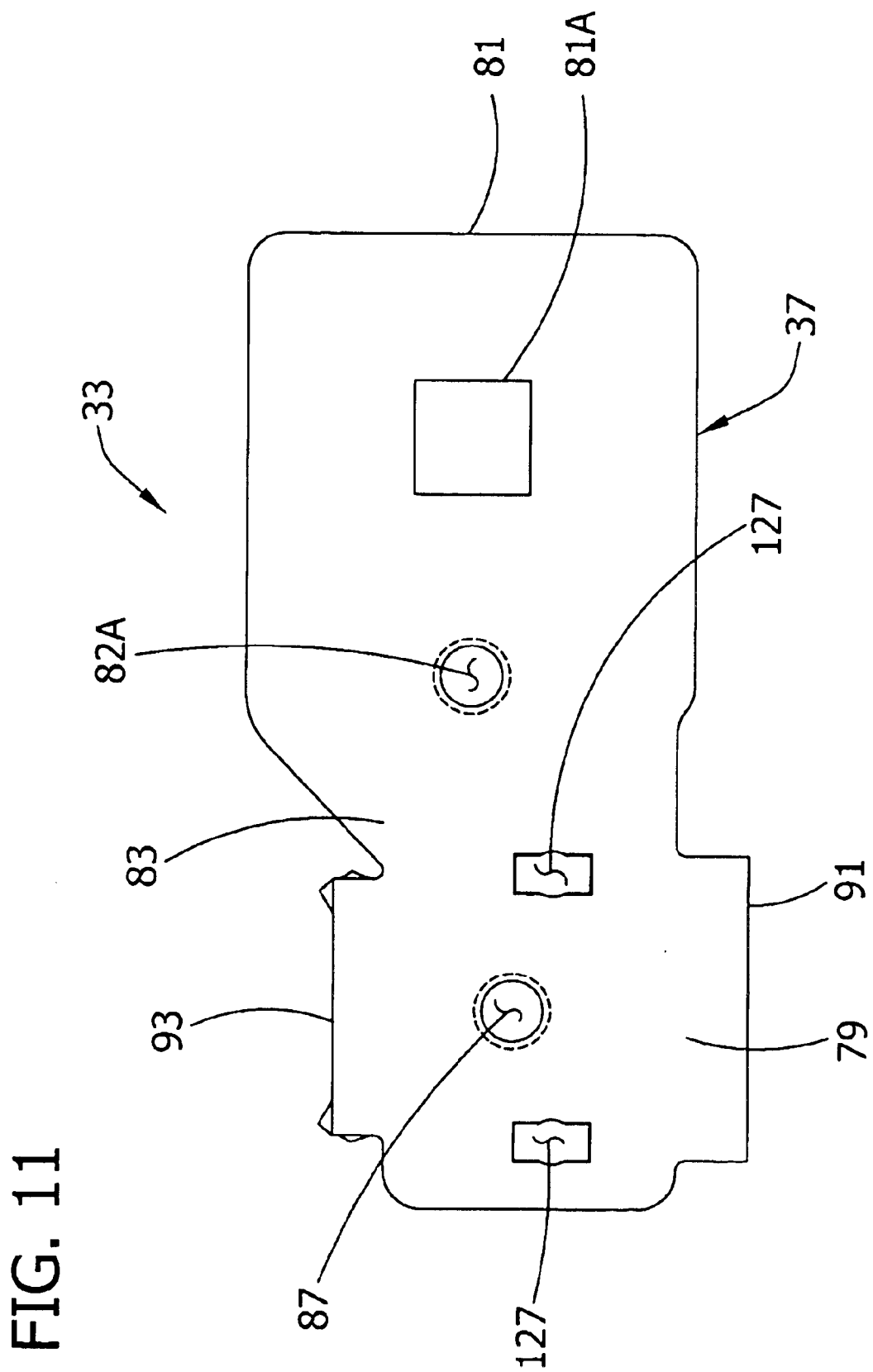
FIG. 11 is a bottom plan of the jaw support of FIG. 7.

In the embodiment shown in FIG. 9, the web 103 of the jaw mount 39 is formed with a generally C-shaped lower region 131 formed by a series of bends including a first upward bend 132 at side 91 of the base 37, a second inward bend 133 spaced a distance 134 up from the base, and a third upward bend 135 spaced a distance 136 inward from the second bend 133. Likewise, in the embodiment shown in FIG. 9, the lower portions of the flanges 99 are spaced apart from the web 103 by a distance 137.

Figure 12:
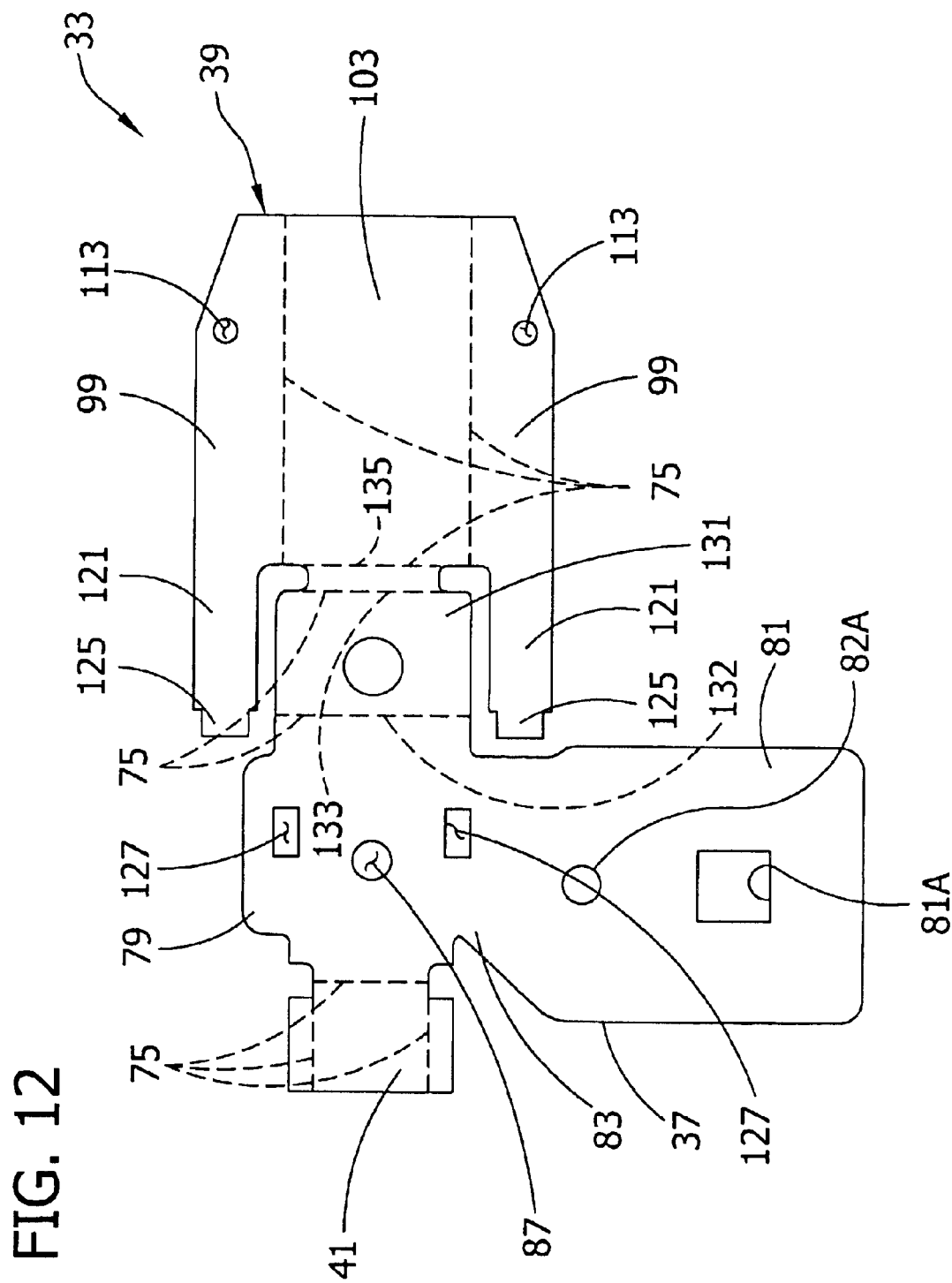
FIG. 12 is a flat pattern suitable for use in the fabrication of a jaw support showing the bend lines involved in forming a jaw support of the preferred embodiment of the present invention from a single piece of sheet metal.

In a stamped-metal construction, the "C" shape of the lower region 131 of the web 103 provides sufficient clearance to stamp tabs 125 out of the same piece of sheet metal as the rest of the jaw support 33. For example, a piece of sheet metal cut to the shape of the pattern in FIG. 12, may be bent along the bend lines 75 into a jaw support 33 having the C-shaped lower region 131 and tabs 125. Because the additional bends 132, 133, 135 of the C-shaped lower region 131 consume additional material, the portion of the pattern corresponding to the web 103 is longer than it would otherwise be. Thus, the portion of the pattern corresponding to the tabs 125 does not overlap other parts of the pattern (e.g., the parts corresponding to the base 37) as it would without the C-shaped lower region 131. Also, by separating the lower portions of the flanges 99 from the C-shaped region 131, the lower ends of the flanges, which are shorter in length than the web 103, can still reach the base 37, not having to travel the more circuitous path of the C-shaped region 131. Furthermore, by spacing the lower ends of the flanges 99 laterally outward away from the web 103, the jaw support 33 can be constructed with a radius of curvature between the lower end of the flanges 99 and the web 103.

Figure 5:
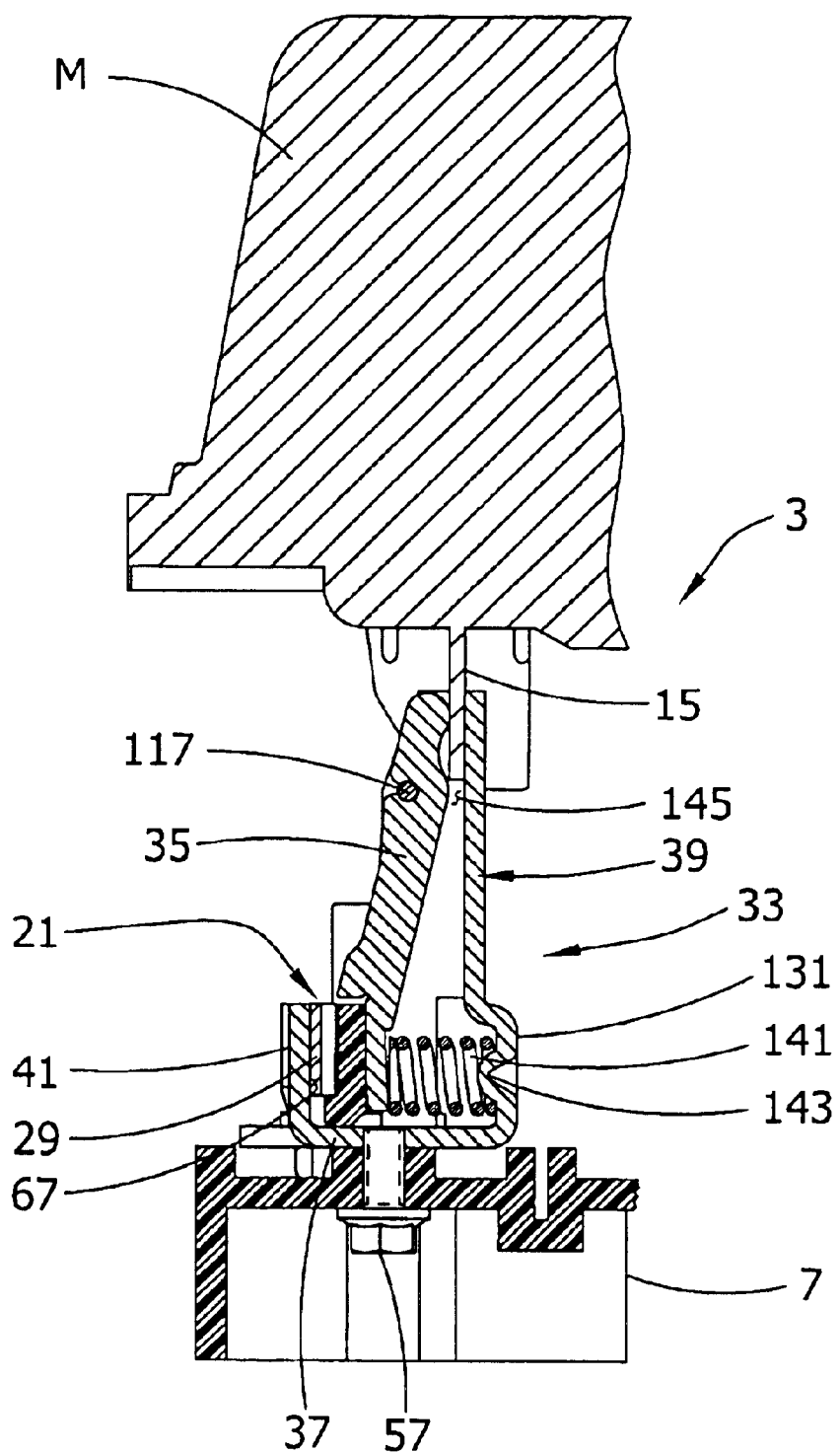
FIG. 5 is an enlarged vertical section in the plane 5—5 of FIG. 4 showing details of a power line connector of the socket assembly.

In the embodiment illustrated in FIGS. 5 and 6, the jaw 35 is formed as a rocker arm (also designated 35) mounted for pivotal movement adjacent its upper end about an axis spaced from and generally parallel to the base 37 between open and closed positions. Other jaw configurations are possible. The rocker arm 35 is mounted by a pin 117 running through the arm 35 and aligned holes 113 (FIG. 9) in the flanges 99 of the jaw mount 39. The pin 117 is spaced below the upper end of the rocker arm 35 and above the lower end of the arm. The lower end of the rocker arm 35 extends downward from the pivotal mount for a distance and at an angle of declination suitable to situate the lower end of the rocker arm adjacent to the line of action 25 of the slide connector 21 and to the contact surface 67 of the contact arm 41. A spring 141 positioned between the web 103 of the jaw mount 39 and the lower end of the rocker arm 35 urges the arm toward its closed position in which the lower end of the arm (jaw) is closer to the contact arm 41 and the upper end of the arm (jaw) is closer to the web 103. The lower C-shaped region 131 of the web 103 is formed with a dome-shaped protrusion 143 which extends into the spring 141 to maintain the spring in position.

As shown in FIG. 2, for example, the area between the upper end of the rocker arm 35 and the upper end of the web 103 of the jaw mount 39 defines a first electrical socket 145 for removably receiving the male electrical connector 15 on the meter M. In one embodiment (FIG. 5), a small gap of about 0.090 in. is provided in this socket area for receiving a meter spade connector 15 having a thickness of about 0.90 in. Similarly, the area between the lower end of the rocker arm (jaw) 35 and the inner contact surface 67 of the contact arm 41 defines a second electrical socket 147 for removably receiving a respective cam 31 on the metal conduction strip 29 of the slide connector 21.

The bypass system described above is normally in its non-bypass mode, which may also be referred to as the meter operating mode. In this mode (FIG. 3), the connectors 15 on the meter M are plugged into the first sockets 145 of the power line connectors 11 and one or both cams 31 on each metal conduction strip 29 of the slide connector 21 are out of electrical contact with one or both sockets 145 of respective power line connectors 11. As a result, in the non-bypass mode current flows from each power supply line PS1, PS2 to a respective power load lines PL1, PL2 via a first path which runs through the base 37 and jaw mount 39 of a respective power supply line connector 11, through the meter 21, and then through the jaw mount 39 and base 37 of a respective power load line connector 11. Because of the one-piece construction of the jaw support 33, electric current flows along a joint-free path through the jaw support.

When each slide connector 21 is moved from its non-bypass (meter operating) position shown in FIG. 3 to the bypass position shown in FIG. 2, the cams 31 on the ends of the metal conduction strip 29 of the slide connector 21 are forcibly wedged into the second sockets 147 of the respective power line connectors 11. As the cams 31 move into the second sockets 147, they force the jaws (e.g., rocker arms 35) to pivot against the bias of the springs 141, thereby opening the second sockets so that the cams on the metal conduction strip can move into electrical contact with the inner surfaces 67 of the contact arms 41 of the connectors 11. Thus, during operation in bypass mode, the bypass system permits current to flow from a power supply line PS1, PS2 to a respective power load line PL1, PL2 via a second path which bypasses the meter, i.e., through the base 37 and contact arm 41 of one power supply line connector 11, through the slide connector 21, and then through the contact arm 39 and base 37 of a respective power load line connector. As a result, the meter can be unplugged from the socket assembly 3 without interruption of power to the facility being serviced.

Figure 13:
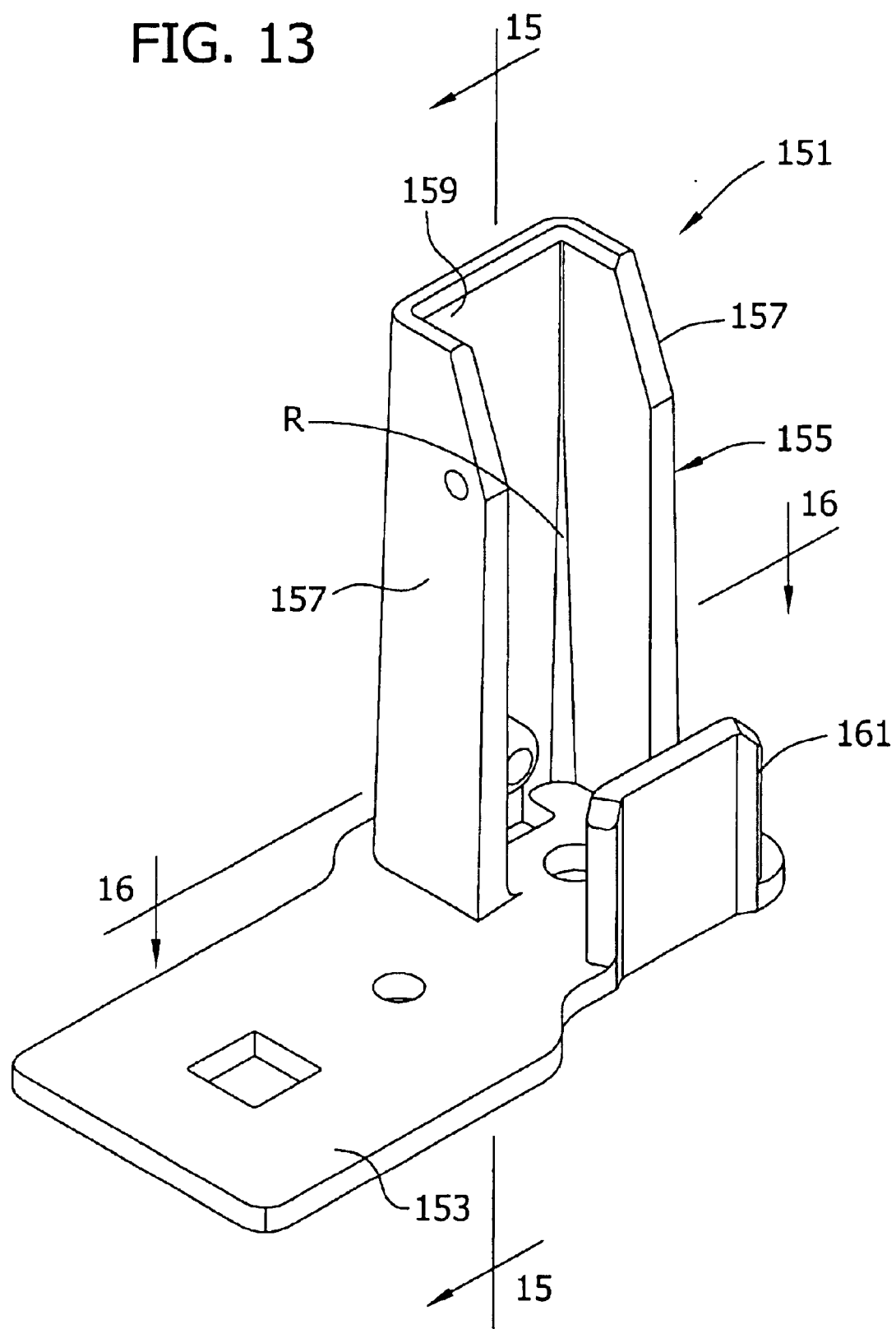
FIG. 13 is front perspective of an alternative one-piece jaw support of the present invention.
Figure 14:
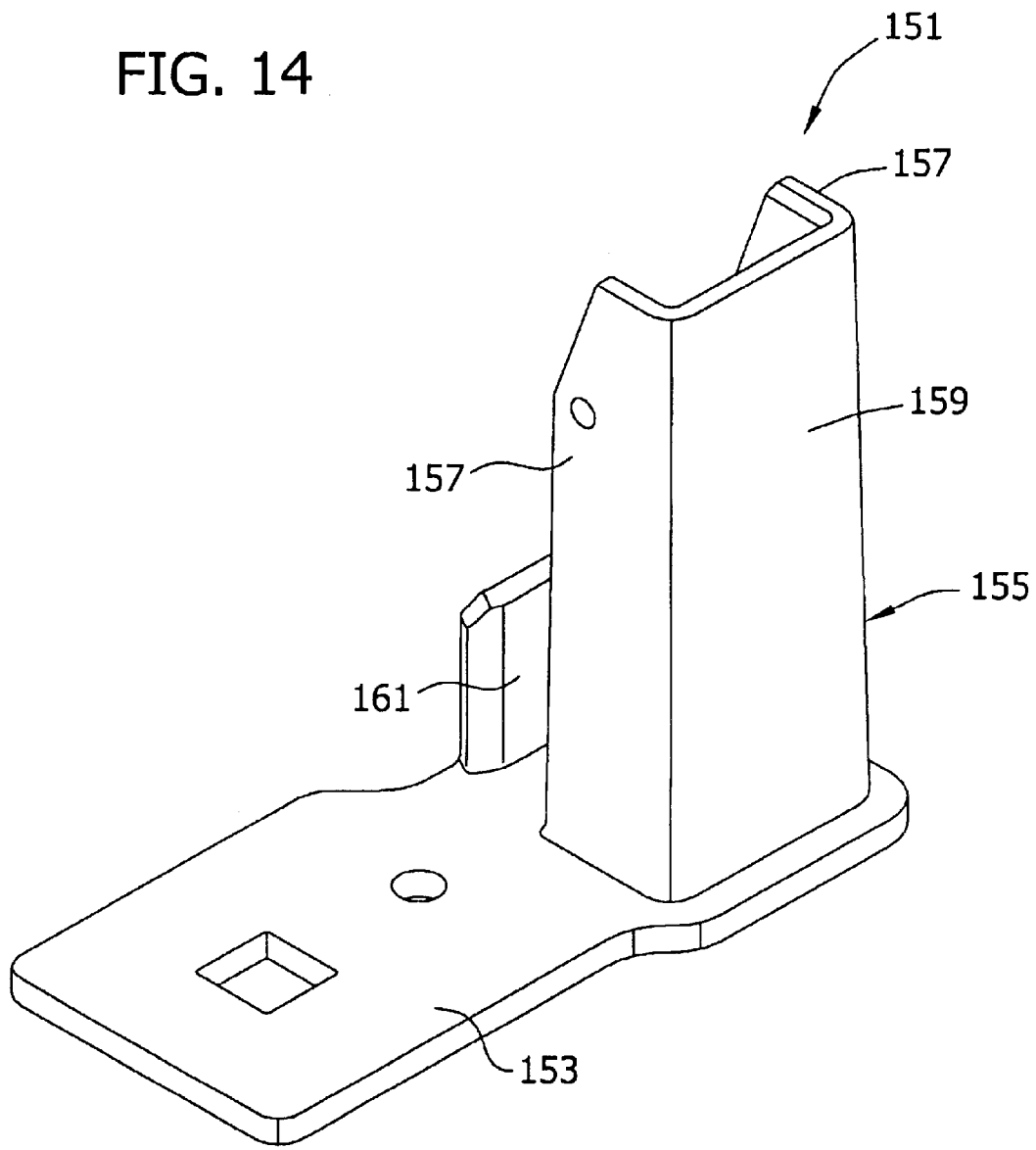
FIG. 14 is a rear perspective of the jaw support of FIG. 13.
Figure 15:
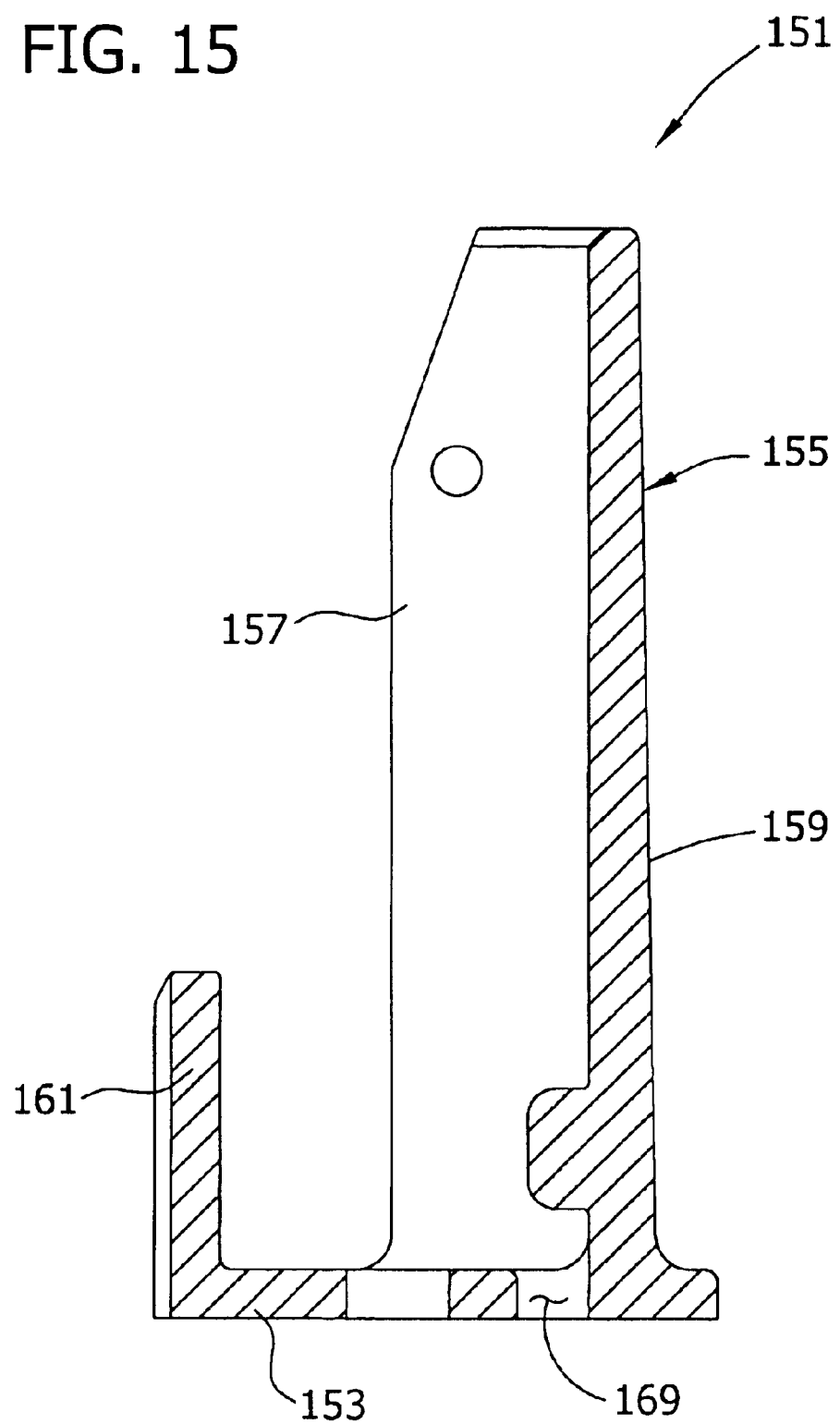
FIG. 15 is a vertical section along line 15—15 of FIG. 13.
Figure 16:
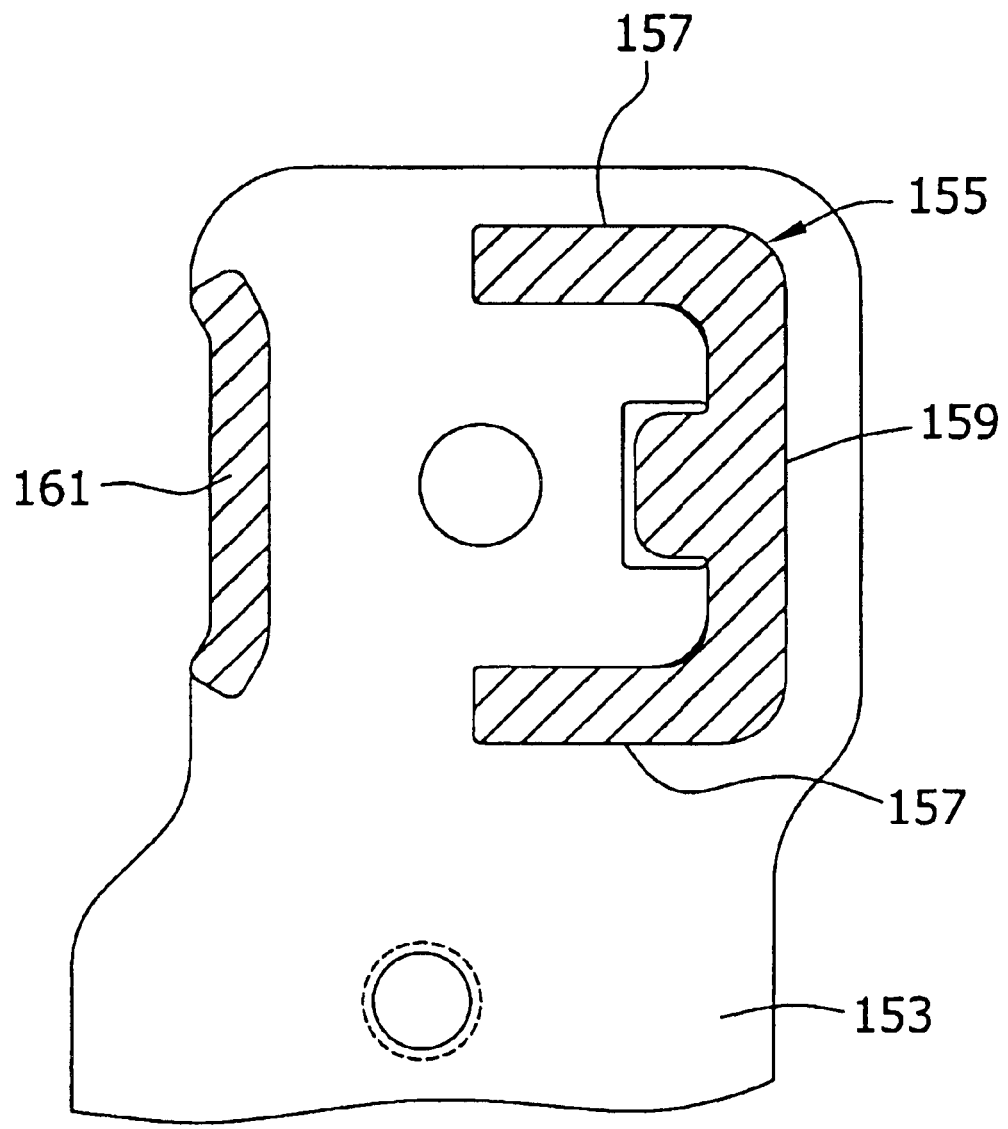
FIG. 16 is a horizontal section along line 16—16 of FIG. 13.

FIGS. 12–15 show a jaw support of alternative construction, designated generally by the reference number 151. This support 151 is similar to the sheet-metal jaw support 33 previously described, except that it is formed as a one-piece cast metal structure. The metal used is a suitable conductor of electrical current, such as a copper alloy. The jaw support of this embodiment also comprises a base 153 and a channel-shaped jaw mount 155 extending up from one side of the base and having opposing flanges 157 and a web 159. In one embodiment, the cast jaw support 151 includes fillets R (one of which is shown in FIG. 13) at the transitions from the web 159 to the flanges 157. The fillets R are tapered as shown in FIG. 13 from a relatively smaller size, e.g., radius of curvature, away from the base 153 (for providing ample clearance for pivotal movement of the jaw at the top of the jaw support 151) to a relatively larger size adjacent the base 153 (for added structural strength to better withstand lateral forces from actuation of the slide connector 21). Like jaw support 33, a contact arm 161 extends up from the opposite side of the base in a position to face the lower end of a jaw (not shown) pivoted on the jaw mount. Jaw support 151 functions in the same manner as jaw mount 35, and it too provides a joint-free path for the flow of electrical current.

The one-piece jaw supports described above at 35 and 151 may have other configurations without departing from the scope of this invention.

Figure 17:
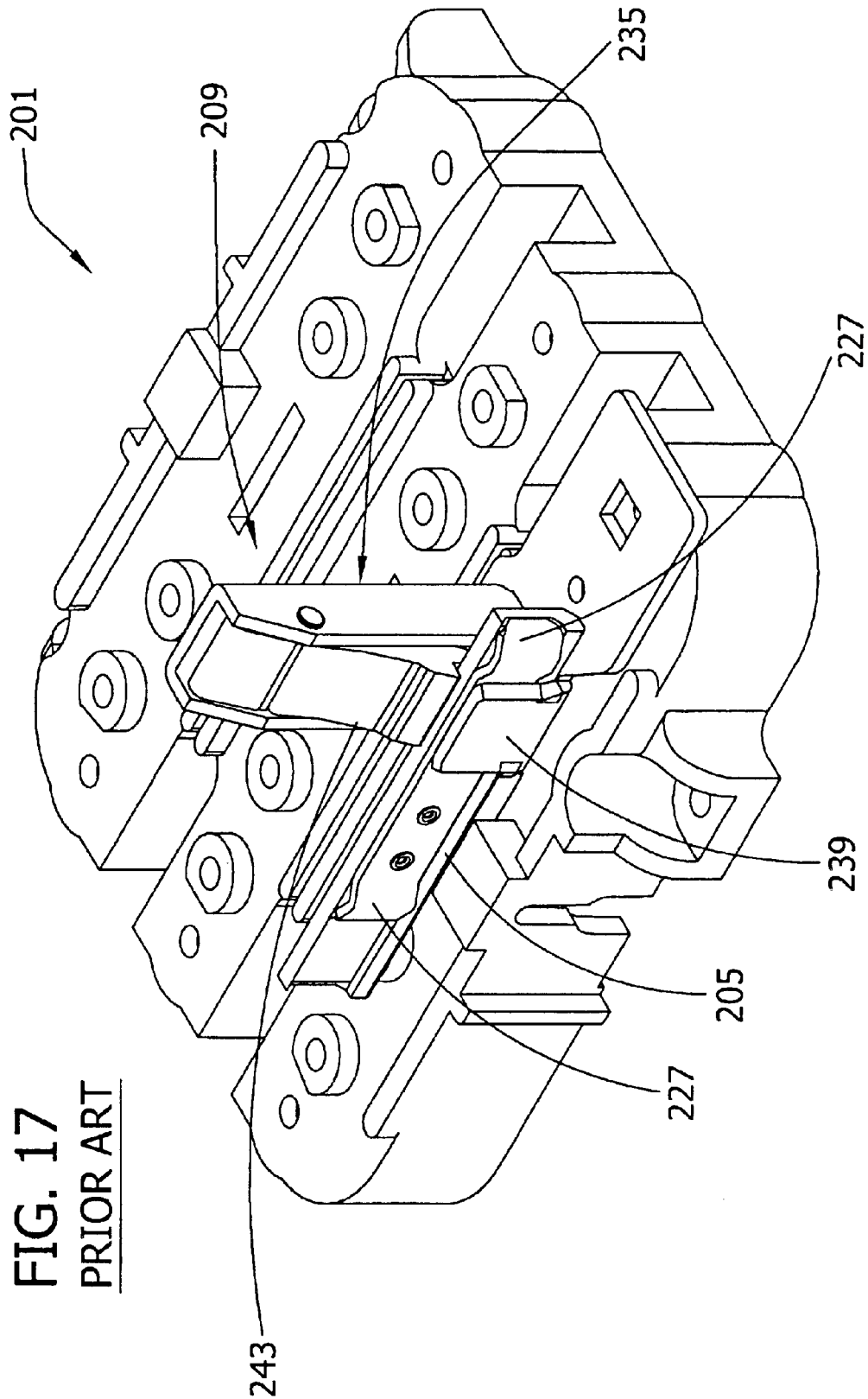
FIG. 17 is a perspective of a socket assembly similar to the assembly of FIG. 2 but using prior art power line connectors (only one of which is shown)
Figure 18:
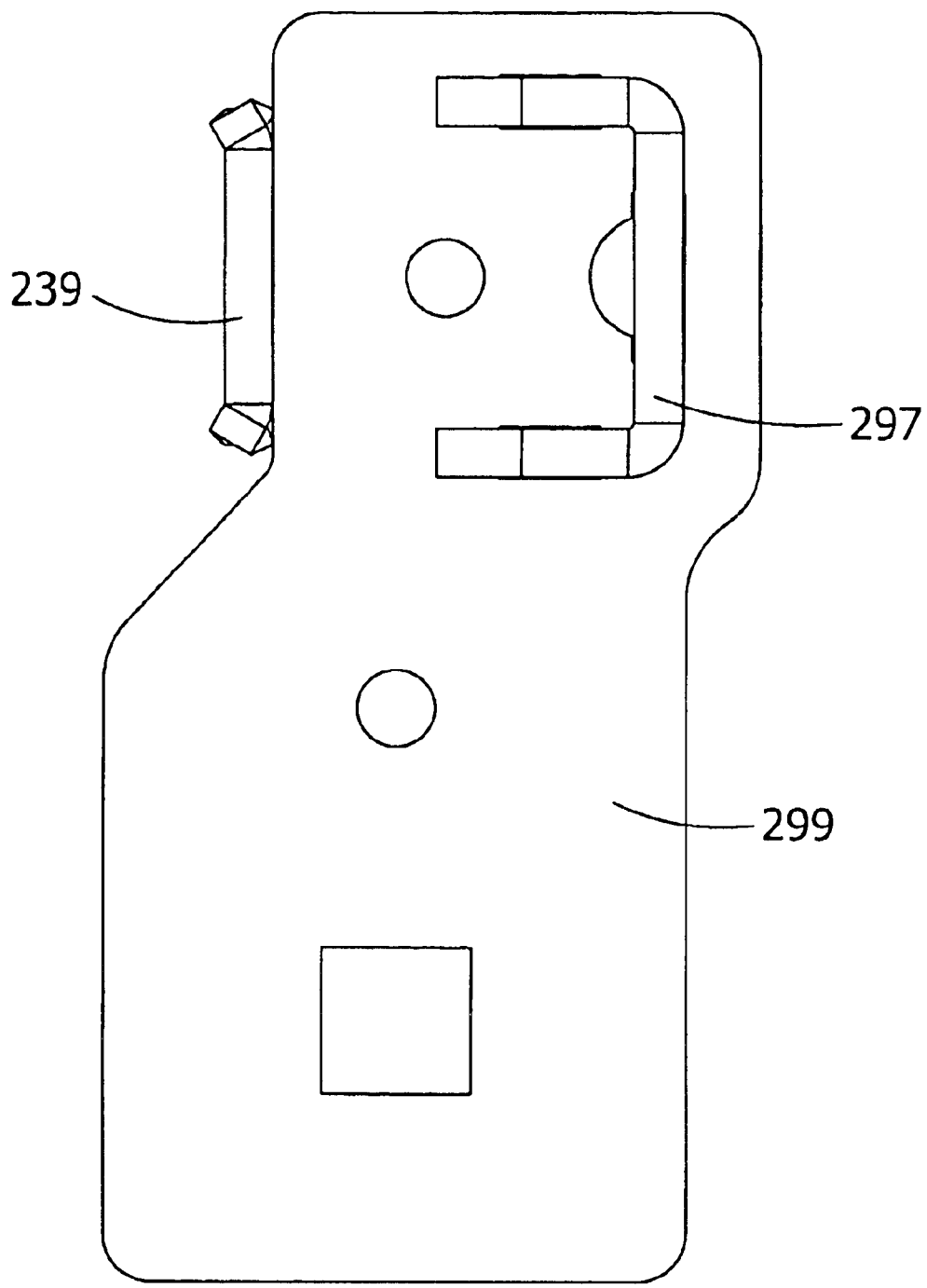
FIG. 18 is a top plan of the prior art power line connector shown in FIG. 17.
Figure 19:
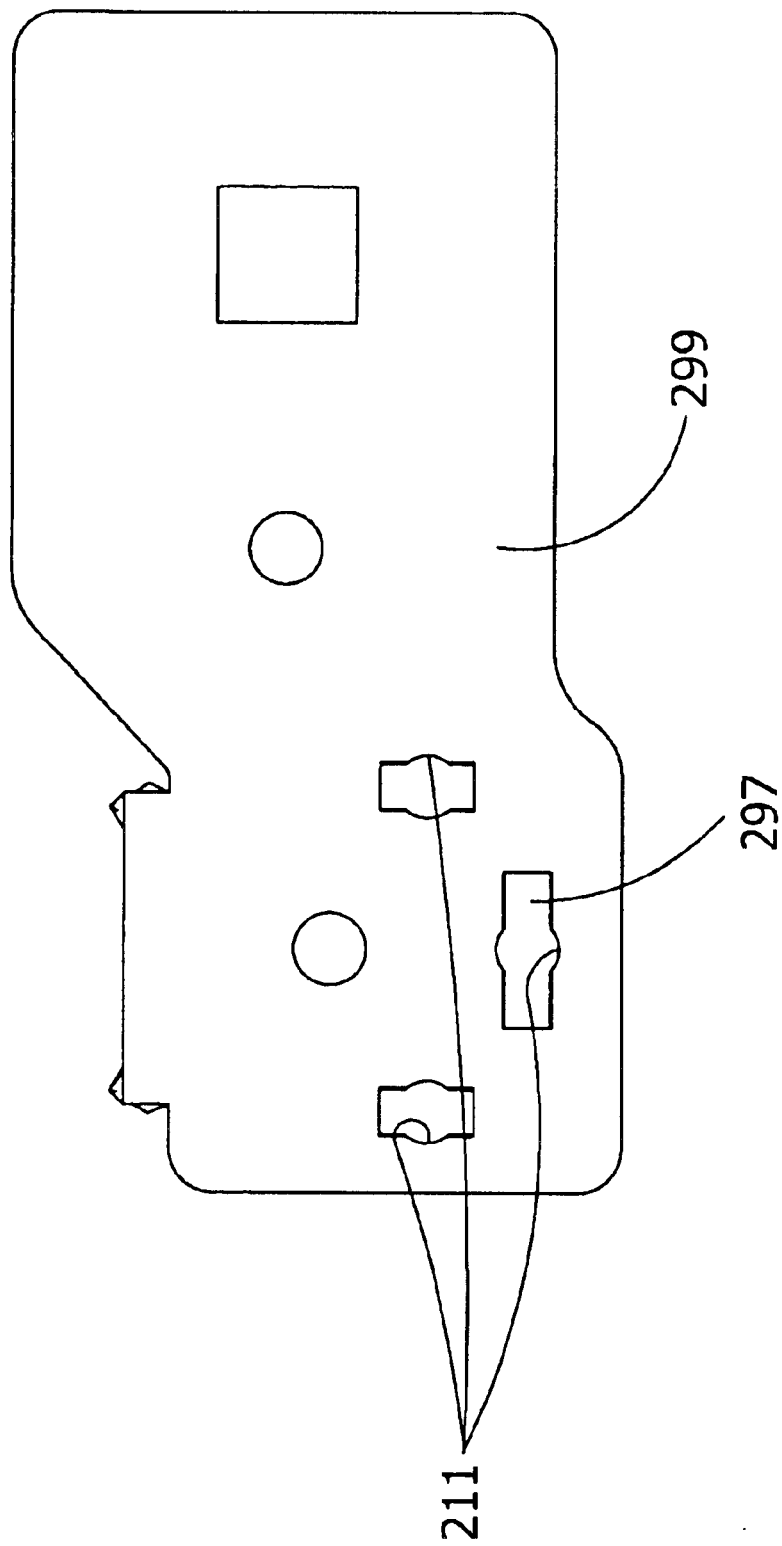
FIG. 19 is a bottom plan of the prior art power line connector shown in FIG. 17.

To illustrate the difference between the socket assembly 3 described above and a conventional system, FIGS. 17–19 show a particular type of socket assembly having a prior art bypass system 201. As shown in FIG. 17, the bypass system 201 comprises a slide connector 205 with a metal conduction strip 227 slidably mounted between a first power line connector (not shown) connected to an electric power supply line and a second power line connector 209 connected to an electric power load line. Each power line connector comprises a metal jaw support 235, a jaw 243 pivotally mounted on the jaw support, and a spring (not shown). Notably, as shown in FIGS. 18 and 19, the jaw support 235 is constructed of a first piece of metal which forms the jaw mount 297 and a second metal piece which forms the base 299 and contact arm 239. The jaw mount 297 and base 299 are joined together at joints 211 by being swaged, riveted or brazed together in an assembly process. During normal operation in the non-bypass mode, electrical current is required to flow through the joints 211, thereby creating the problems previously discussed. Likewise, the joints 211 weaken the structure because they are the primary source of structural strength between the jaw mount 297 and the jaw base 299.

FIGS. 20–23 show another embodiment of a power line connector, generally indicated at 301, equipped with a current diverter, generally designated 303, for reducing heat build-up in the connector. In the embodiment shown in FIGS. 20–23, the power line connector 301 is substantially identical to the power line connector 11 previously described, so corresponding parts are indicated by corresponding reference numbers for convenience. However, it will be understood that the current diverter 303 could be used with power line connectors of different constructions.

Figure 20:
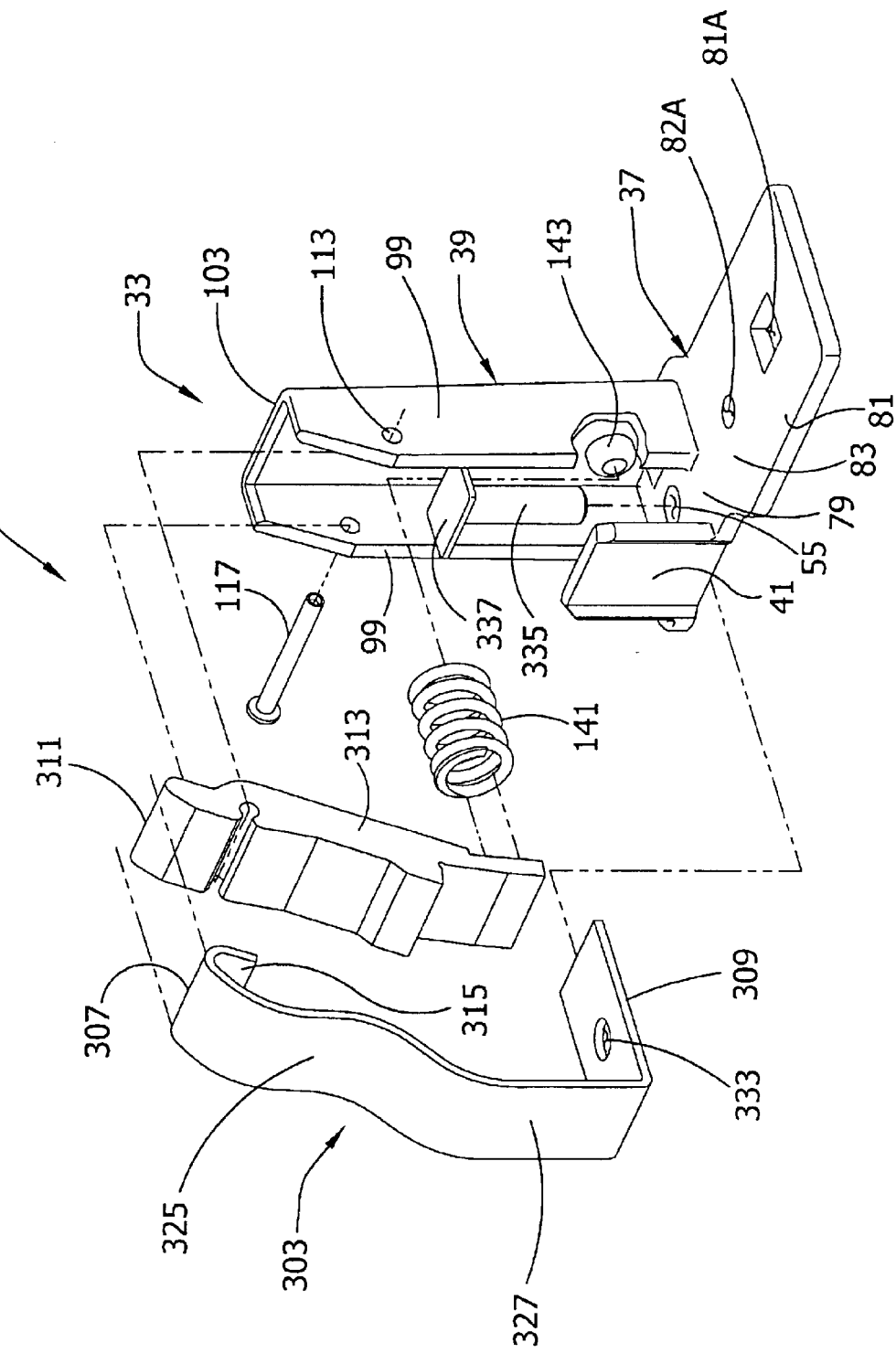
FIG. 20 is an exploded view of a power line connector of a different embodiment incorporating one version of a current diverter of this invention.

In general, the current diverter 303 functions to divert some electric current from the first (meter) socket 145 of the power line connector 301 along a current path separate from the jaw mount 39, thus reducing the amount of current flowing through the jaw mount and the heat-build up in the jaw mount. In one embodiment (FIG. 20), the current diverter 303 is configured for diverting electric current from the socket 145 to the base 37 of the jaw support 33 and comprises a conductor in the form of a metal strip, also generally designated 303, having an upper end 307 in electrical contact with the socket and a lower end 309 in electrical contact with the base 37. In FIGS. 20 and 21, the upper end 307 of the metal strip 303 is configured (e.g., hook-shaped) to hook over an upper end 311 of the jaw 313 and extend down into the socket 145 to a position where an inner surface 315 of the strip contacts the inner surface 317 of the jaw and an outer surface 321 of the strip faces toward the web 103 of the jaw mount 39. When the jaw 313 is in its closed position, the metal strip 303 is preferably but not necessarily spaced from the web 103 to create a gap for insertion of a respective meter connector 15. For example, the gap may be about a 0.090 in. gap for receiving a meter spade connector having a thickness of about 0.90 in.

In this embodiment, the upper end 311 of the jaw 313 is of reduced size compared to the upper end of the jaw 35 of the first embodiment to maintain the same gap size.

In the embodiment shown in FIGS. 20 and 21, the metal strip 303 has a curved upper section 325 which extends down from the hook-shaped upper end 307 of the strip on the outside face 326 of the jaw 313, a substantially straight vertical section 327 extending down from the curved section along the contact arm 41, and a lower horizontal section 309 which underlies the base 37. The particular shape of the metal strip 303 between its upper and lower ends 307,309 is not critical, the particular curve shown in FIG. 20 being provided to obtain the clearance necessary for a protective shield (not shown) which fits over the socket assembly 3.

The current diverter 303 is secured to the jaw support 33 by a fastener 335 which, in one embodiment, extends through aligned holes 55,333 in the base 37 of the jaw support 33 and lower horizontal section 309 of the metal strip 305. As shown in FIGS. 20–22, the fastener 335 is a bolt advantageously having a rectangular head 337 which fits between the side flanges 99 of the jaw mount 39. The size of the head 337 is such that it engages the side flanges 99 to prevent turning of the bolt 335 when a nut (not shown) is threaded on the bolt. This feature facilitates the assembly process during which access to the head 337 of the bolt 335 may be restricted by the overlying spring 141 and rocker arm 35. In one assembly process, for example, the bolt 335 is first inserted through the hole 55 in the base 37 of the jaw support 33, following which the spring 141 is placed on the spring seat 143 of the jaw mount 39. The lower end of the jaw 313 is then placed between the contact arm 41 and the spring 141. After the upper end 307 of the current diverter 303 is positioned on the upper end 311 of the jaw, the jaw is mounted on the jaw mount 39 using a suitable pivot shaft 117 (e.g., a rivet). A nut is then threaded up on the bolt 335 and tightened. Other fasteners or means of securing the current diverter 303 to the jaw support 33 can be used without departing from the scope of this invention. The fastener could be, for example, a carriage bolt having a round head and rectangular shoulder. Further, the metal strip 303 could be secured to the jaw support 33 at other locations.

In use, the current diverter 303 reduces the amount of current flowing through the jaw mount 39, thereby reducing heat build-up in the jaw mount. The amount of current diverted through the strip 303 can vary over a wide range. Further, the amount of current diverted can be varied as needed or desired by changing the dimensions and/or composition of the strip 303. In one application, the current diverter is configured to divert an amount of current sufficient to prevent the temperature at any location on the jaw 35 and jaw mount 39 from exceeding a predetermined temperature above ambient temperature. (As used herein, "ambient temperature" means 25° C.±5° C.) For example, in one embodiment, the metal strip 303 is a strip of suitable copper (e.g., 110 copper ½ hard M916) with a tin plate finish (F33) having a width of about 0.75 in. and a thickness of 0.06 in., and it diverts an amount of current sufficient to prevent the temperature at any location on the jaw 35 and jaw mount 39 from exceeding 65° C. above ambient temperature. Current diverters having other dimensions, shapes and constructions can be used, depending on need or desire.

FIGS. 24 and 25 show another embodiment of a current diverter, generally designated 345. Current diverter 345 is essentially identical to the current diverter 303 of the previous embodiment except that the metal strip has a curved section 349 of different shape.

FIGS. 26–40 show a variety of power line connectors equipped with current diverters of different configurations FIGS. 26 and 27 show a current diverter, generally designated 355, comprising a metal strip 357 having a hook-shaped upper end 359, a curved upper section 361 and a straight lower section 363 which is fastened to the contact arm 365 of the jaw support by means of a threaded fastener 367 (e.g., screw). In this embodiment, the current diverter 355 has no lower horizontal section underlying the base of the jaw support.

Figure 29:
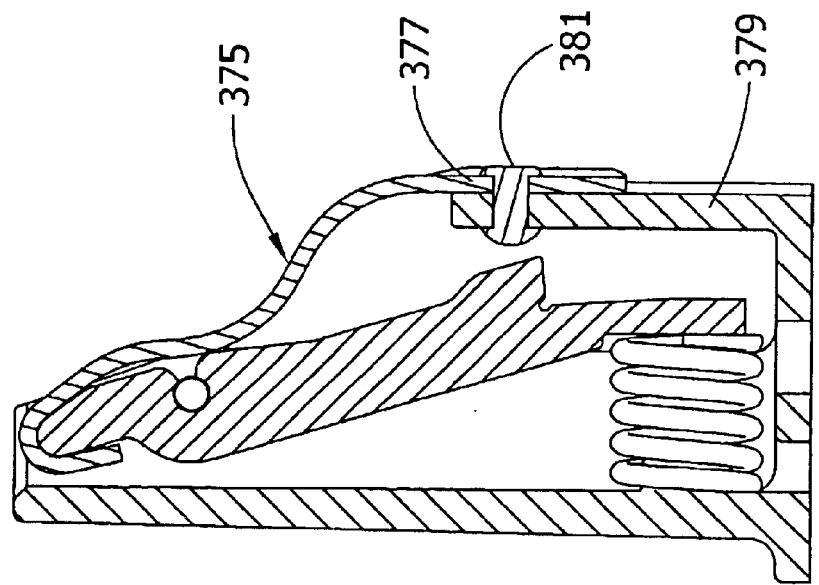
FIG. 29 is a vertical section of the power line connector of FIG. 28.
Figure 28:
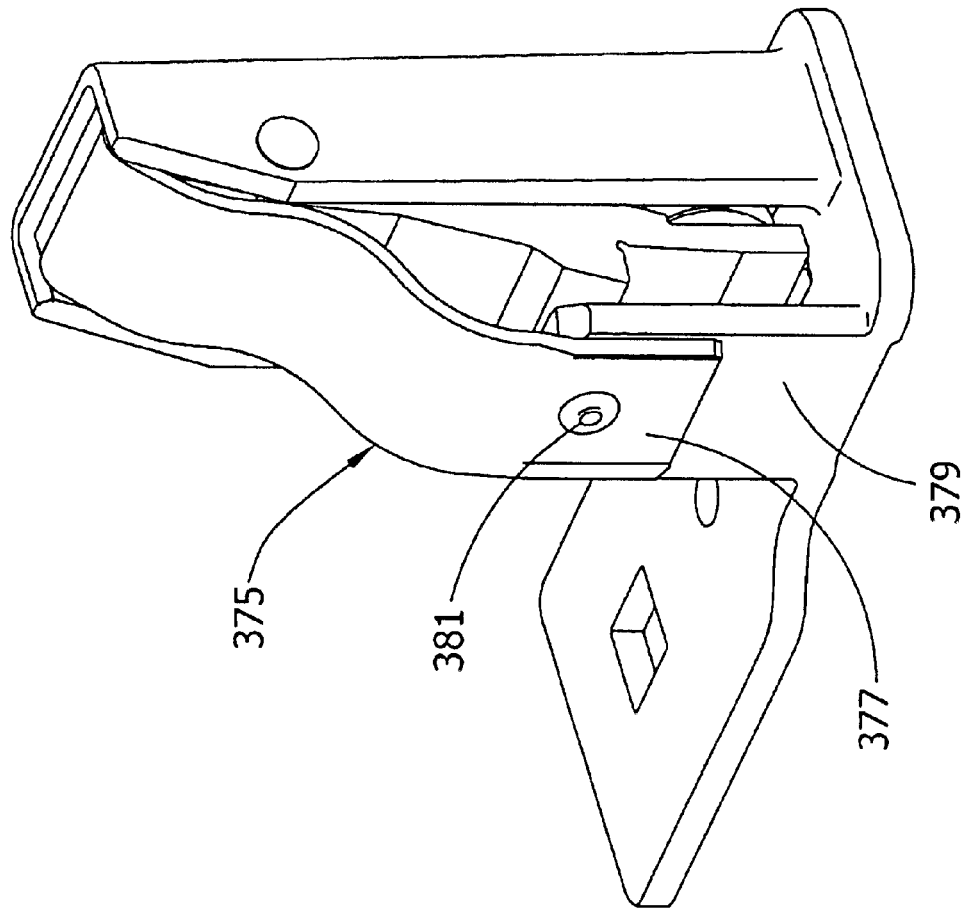
FIG. 28 is a perspective of a power line connector of another embodiment incorporating a different version of a current diverter and a different means of fastening the current diverter to a contact arm.

FIGS. 28 and 29 show a current diverter, generally designated 375, similar to current diverter 355 except that the lower section 377 is somewhat shorter and secured to the contact arm 379 by means of a non-threaded fastener 381, e.g., a rivet.

Figure 31:
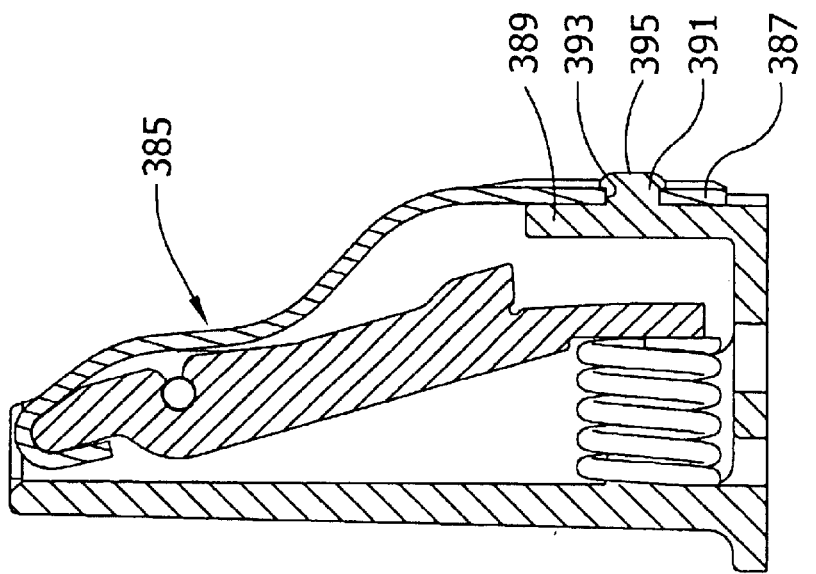
FIG. 31 is a vertical section of the power line connector of FIG. 30.
Figure 30:
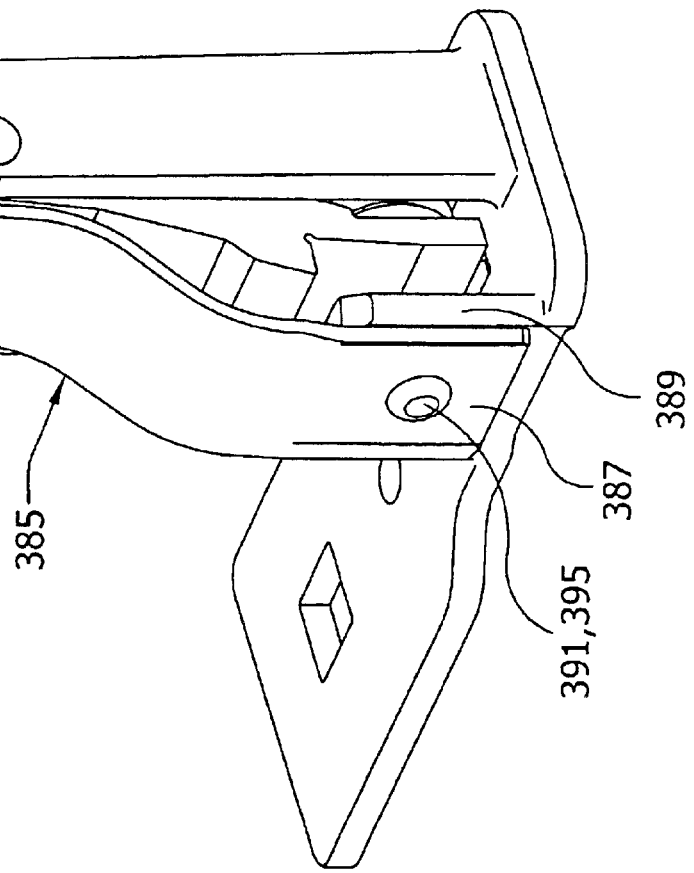
FIG. 30 is a perspective of a power line connector of another embodiment incorporating a different version of a current diverter and a different means of fastening the current diverter to a contact arm.

FIGS. 30 and 31 show a current diverter, generally designated 385, similar to current diverter similar to the three preceding embodiments except that the diverter has a lower section 387 which is secured to the contact arm 389 by means of a retaining member in the form of a button 391, for example, extending from the outer surface of the contact arm, and preferably integrally formed with the contact arm, extending through a hole 393 in the lower section 387 of the metal strip. The button 391 has an outer free end 395 which is crimped or otherwise deformed to fasten the current diverter 385 to the contact arm 389.

Figure 33:
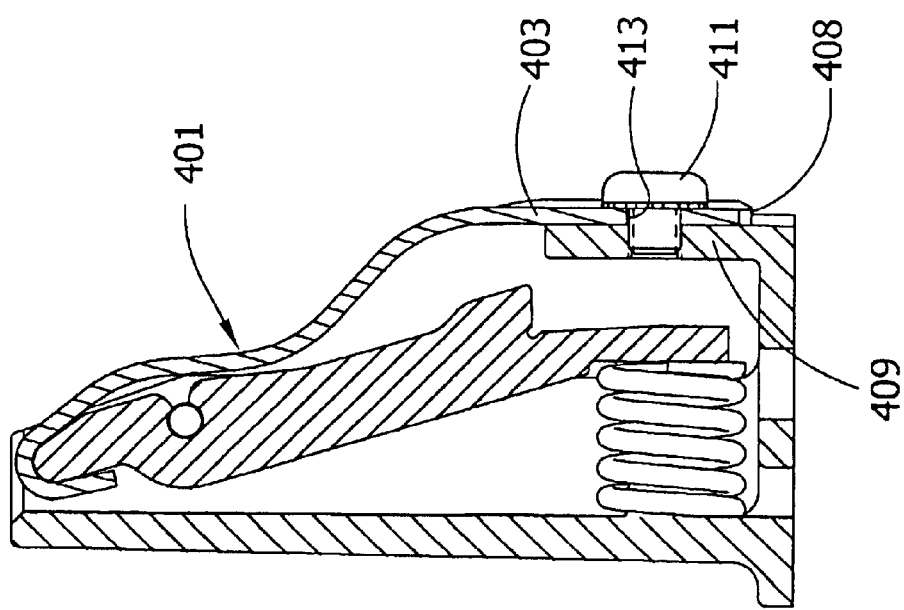
FIG. 33 is a vertical section of the power line connector of FIG. 32.
Figure 32:
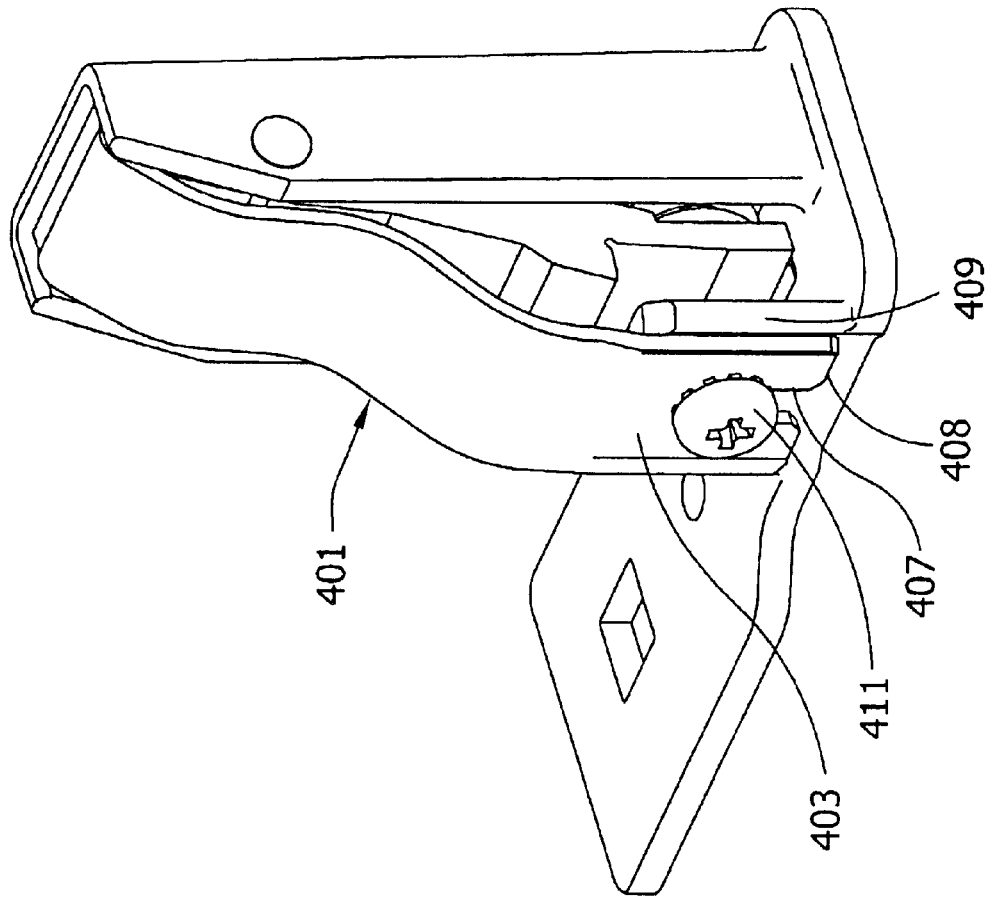
FIG. 32 is a perspective of a power line connector of another embodiment incorporating a different version of a current diverter and a different means of fastening the current diverter to a contact arm.
Figure 36:
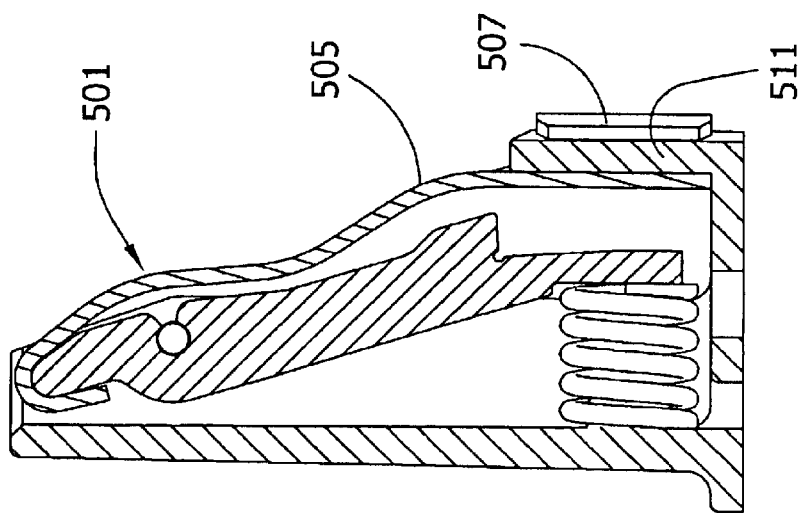
FIG. 36 is a vertical section of the power line connector of FIG. 34.
Figure 35:
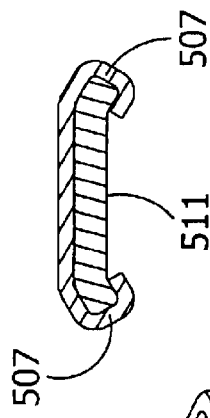
FIG. 35 is a horizontal section along line 35—35 of FIG. 34.
Figure 34:
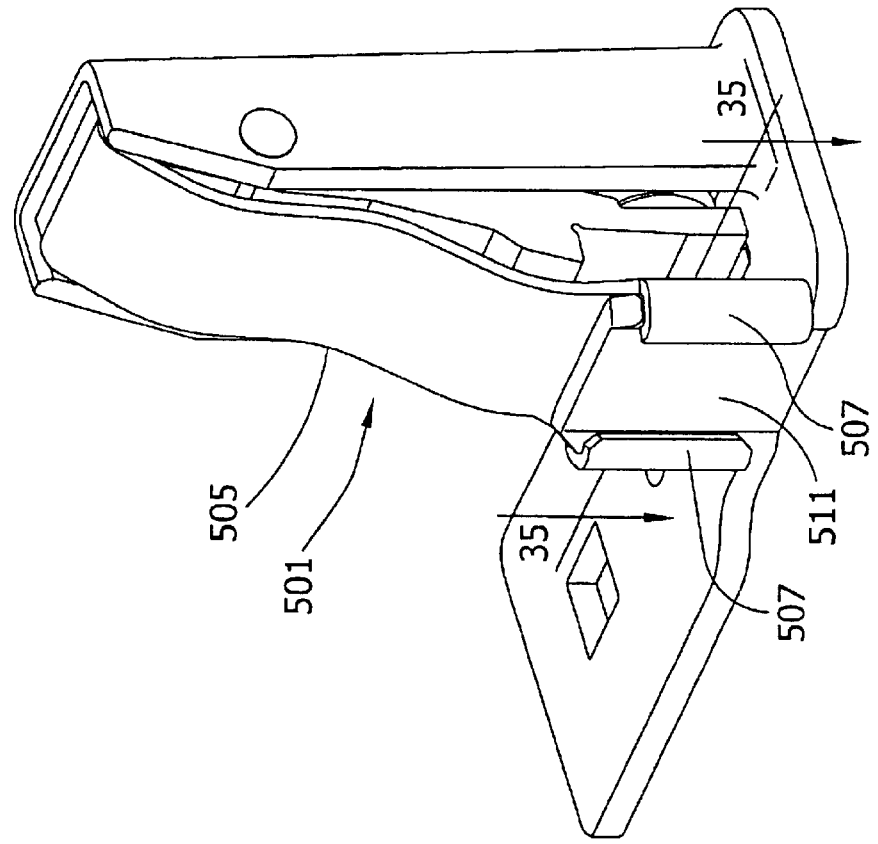
FIG. 34 is a perspective of a power line connector of another embodiment incorporating a different version of a current diverter and a different means of fastening the current diverter to a contact arm.

FIGS. 32 and 33 show a current diverter, generally designated 401, having a lower vertical section 403 formed with a slot 407 extending up from the lower edge 408 of the section. The current diverter 401 is fastened to the contact arm 409 by means of a threaded fastener 411 extending through the slot 407 into a hole 413 in the contact arm 409. This arrangement allows the current diverter 401 to be installed or removed without removing the fastener 411, and also permits some positional adjustment of the current diverted in the direction of the slot 407.

In other embodiments, other means besides screws, pins, rivets and the like are used to fasten the current diverter to the contact arm. In one version, illustrated in FIGS. 34–36, the current diverter (generally designated 501) comprises a metal strip 505 having flanges 507 along opposite sides generally adjacent the lower end of the strip. The flanges 507 are bent to form a channel for receiving the contact arm 511 of the connector, the fit being sufficiently snug to provide a good electrical connection. The flanges 507 are desirably formed integrally with the metal strip 505. Alternatively, a clip or socket formation could be attached to the current diverter 501 for attachment of the diverter to the contact arm 511.

Figure 38:
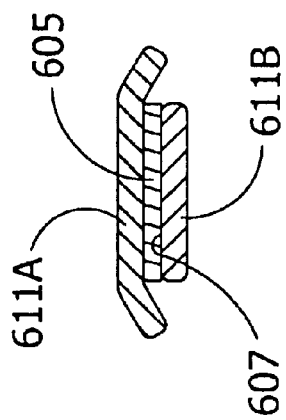
FIG. 38 is a horizontal section along line 38—38 of FIG. 37.
Figure 37:
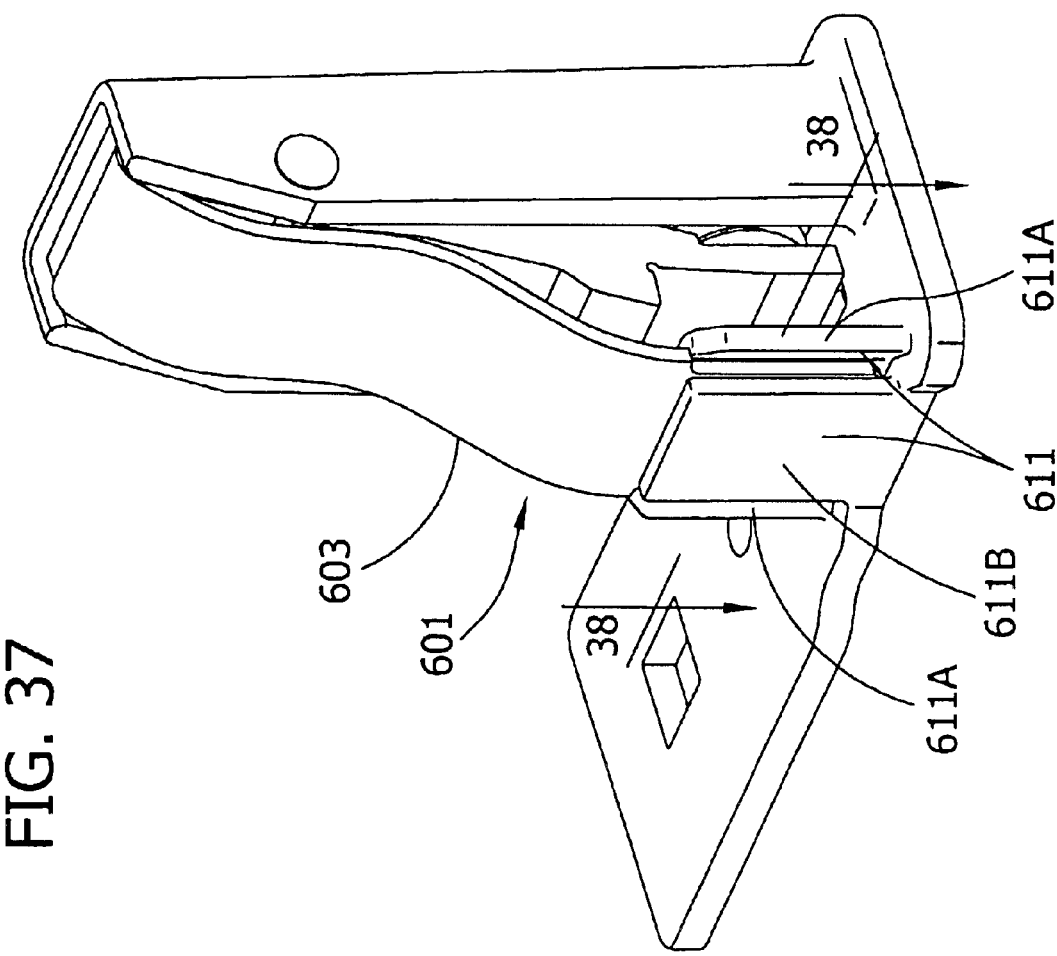
FIG. 37 is a perspective of a power line connector of another embodiment incorporating a different version of a current diverter and a different means of fastening the current diverter to a contact arm.

FIGS. 37 and 38 show an embodiment where the current diverter, generally designated 601, comprises a metal strip 603 having a lower end 605 which fits in a slot 607 between opposing portions 611A, 611B of the contact arm 611. The slot 607 and strip 603 are configured so that the fit of the strip in the slot provides a good electrical connection.

Figure 39:
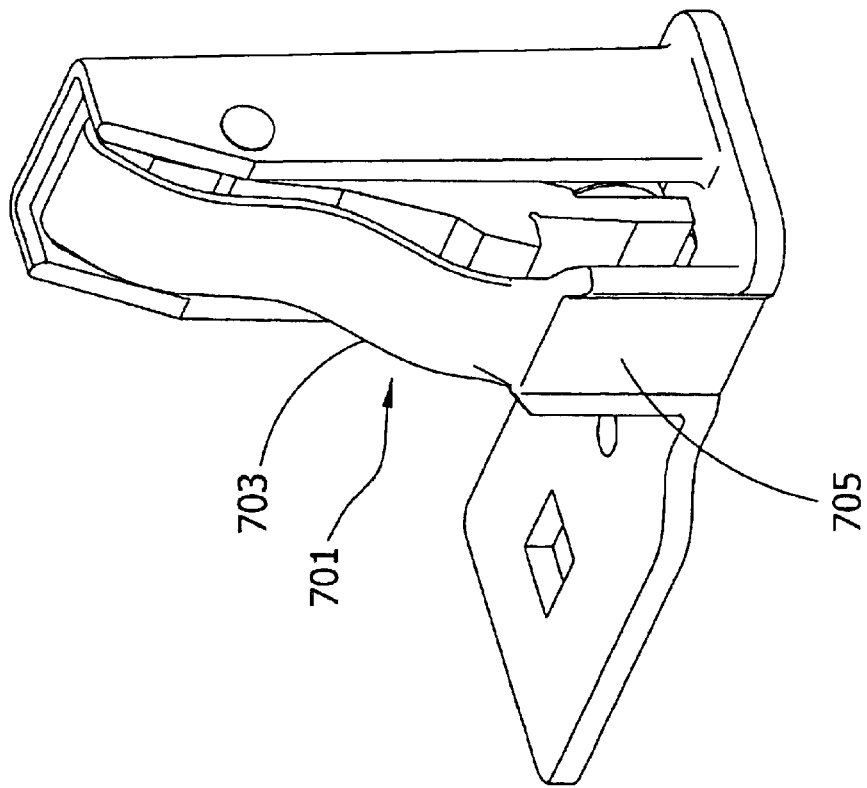
FIG. 39 is a perspective of a power line connector of another embodiment incorporating a different version of a current diverter.

FIG. 39 shows a current diverter, generally designated 701, comprising a metal strip 703 which is formed integrally with the contact arm 705.

Figure 40:
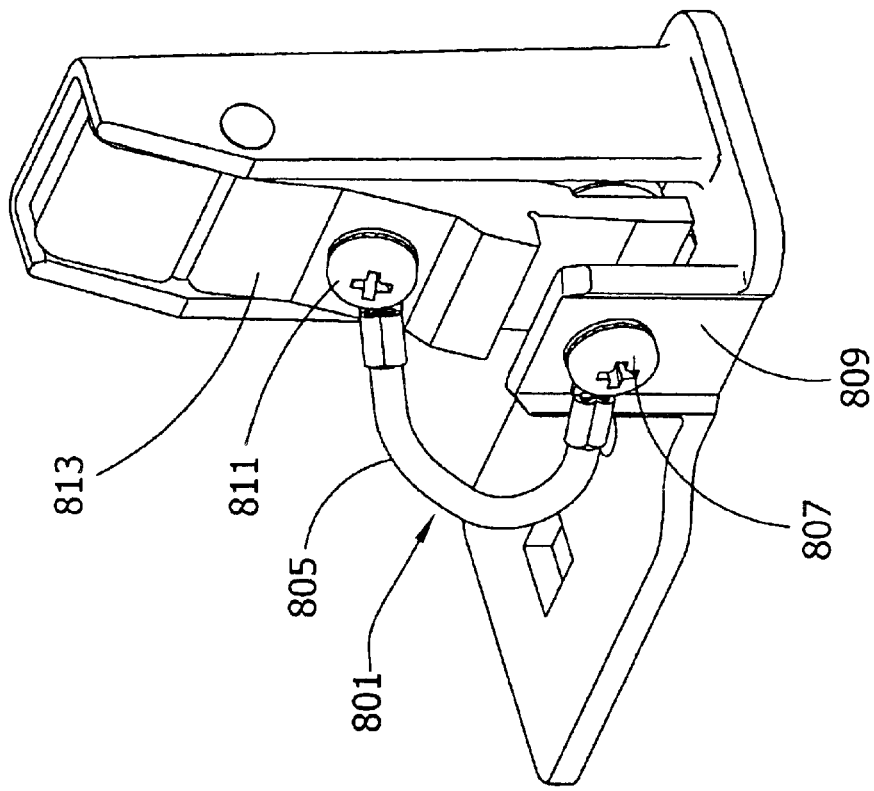
FIG. 40 is a perspective of a power line connector of another embodiment incorporating a different version of a current diverter of this invention.

FIG. 40 illustrates yet another embodiment of a current diverter of this invention, generally designated 801. The diverter 801 comprises a conductive cable 805 having one end secured by a suitable fastener 807 (e.g., a threaded screw) or other means to the contact arm 809 and its opposite end secured by a suitable fastener 811 (e.g., a threaded screw) or other means to the jaw 813 of the jaw support.

As various changes could be made in the above constructions without departing from the scope of the invention, it is intended that all matter contained in the above description and shown in the accompanying drawings shall be interpreted as illustrative and not in a limiting sense.

When introducing elements of the present invention or the preferred embodiment(s) thereof, the articles "a" , "an" , "the" and "said" are intended to mean that there are one or more of the elements. The terms "comprising" , "including" and "having" are intended to be inclusive and mean that there may be additional elements other than the listed elements.

What is claimed is:

1. A socket assembly for a meter box, said socket assembly comprising:

a plurality of power line connectors for connection to electric power lines of an electric power line system, said electric power line system including at least a first power supply line and at least a first power load line; said power line connectors being adapted to mate with mating connectors of an electric meter to establish a first current path from the first power supply line to the first power load line through the electric meter; and a meter bypass system for establishing a second current path from the first power supply line to the first power load line bypassing the electric meter to permit removal of the meter without interruption of electric service, said bypass system comprising at least one slide connector comprising a metal conductor mounted for back and forth sliding movement of the conductor along a generally straight line of action extending between first and second power line connectors of said plurality of power line connectors;

each of said first and second power line connectors comprising:

a jaw;

a jaw support comprising a base, a jaw mount extending up from the base having opposing spaced apart flanges with lower ends connected to the base, said opposing flanges mounting said jaw therebetween for pivotal movement between open and closed positions, a web spanning and integrally connecting at least a portion of said first and second flanges and integrally connecting the jaw mount to the base, and a contact arm extending up from the base having an inner contact surface generally opposing the web of the jaw mount;

said base, jaw mount and contact arm being formed as a one-piece structure to provide a joint-free path for flow of electrical current;

a first socket formed between said jaw and said jaw mount for receiving a respective electrical connector of said electric meter; and a second socket formed between said jaw and said contact arm for electrical connection with said conductor on the slide connector;

said slide connector being slidable between a meter operating position in which said metal conductor is out of electrical contact with at least one of the second sockets of said first and second power line connectors whereby current is adapted to flow along said first current path through said electric meter when the electrical connectors of the electric meter are in said first sockets of the first and second power line connectors, and a meter bypassing position in which said metal conductor of the slide connector is in electrical contact with the second sockets of both of the first and second power line connectors whereby current is adapted to flow along a second current path from the power supply line to the power load line when the electrical connectors of said electric meter are removed from said first sockets of the first and second power line connectors.

2. A socket assembly as set forth in claim 1 wherein said jaw support is formed as a single sheet of bent metal.

3. A socket assembly as set forth in claim 2 wherein at least one of said first and second flanges has a lower end tab secured in an opening in said base.

4. A socket assembly as set forth in claim 2 wherein both of said first and second flanges of the jaw mount have lower end tabs secured in openings in said base.

5. A socket assembly as set forth in claim 2 wherein said lower end tab has a stake connection with said base.

6. A socket assembly as set forth in claim 2 wherein said web of the jaw mount has a generally C-shaped lower region.

7. A socket assembly as set forth in claim 6 wherein a tab extends down from at least one of said first and second flanges of the jaw mount, said tab being secured in an opening in the jaw support base.

8. A socket assembly as set forth in claim 6 wherein lower portions of said first and second flanges are spaced away from said C-shaped lower region of the web.

9. A socket assembly as set forth in claim 8 wherein said first and second flanges have upper portions and lower portions narrower than said upper portions.

10. A socket assembly as set forth in claim 1 wherein said base has a generally planar first end region disposed below the jaw mount, a second end region adapted for connection to said power load line or to said power supply line, and a middle region connecting the first and second end regions.

11. A socket assembly as set forth in claim 10 wherein said first and second end regions and said middle region are flat and generally co-planar.

12. A socket assembly as set forth in claim 10 wherein said middle region is narrower than said first and second end regions.

13. A socket assembly as set forth in claim 1 wherein said one-piece structure is a cast metal structure.

14. A socket assembly as set forth in claim 13 wherein the cast metal structure further comprises fillets at the junctions of the web and the flanges, said fillets tapering from a relatively smaller size away from the base to a relatively larger size adjacent the base.

15. A power line connector for use in a socket assembly in a meter box, said power line connector comprising:

a jaw;

a jaw support comprising a base, a jaw mount extending up from the base having opposing spaced apart flanges with lower ends connected to the base, said opposing flanges mounting said jaw therebetween for pivotal movement between open and closed positions, a web spanning and integrally connecting at least a portion of said first and second flanges and integrally connecting the jaw mount to the base, and a contact arm extending upward from the base having an inner contact surface generally opposing the web of the jaw mount;

said base, jaw mount and contact arm being formed as a one-piece metal structure to provide a joint-free path for flow of electrical current;

a bypass system comprising at least one slide connector having a metal conductor mounted for back and forth sliding movement of the conductor;

a first socket formed between said jaw and said jaw mount for receiving a mating electrical connector of an electric meter; and a second socket formed between said jaw and said contact arm for receiving the slide connector of the bypass system mounted in said meter box for back and forth sliding movement along a generally straight line of action generally parallel to the contact arm of the jaw support.

16. A power line connector as set forth in claim 15 wherein said jaw support is formed as a single sheet of bent metal.

17. A power line connector as set forth in claim 16 wherein at least one of said first and second flanges of the jaw mount has a lower end tab secured in an opening in the base.

18. A power line connector as set forth in claim 16 wherein both of said first and second flanges of the jaw mount have lower end tabs secured in openings in the base.

19. A power line connector as set forth in claim 17 wherein said lower end tab has a stake connection with the base.

20. A power line connector as set forth in claim 16 wherein said web of the jaw mount has a generally C-shaped lower region.

21. A power line connector as set forth in claim 20 wherein a tab extends down from at least one of said first and second flanges of the jaw mount, said tab being secured in an opening in the jaw support base.

22. A power line connector as set forth in claim 20 wherein lower portions of said first and second flanges are spaced apart from said C-shaped lower region of the web.

23. A power line connector as set forth in claim 20 wherein said first and second flanges have upper portions and lower portions narrower than said upper portions.

24. A power line connector as set forth in claim 16 wherein said base has a generally planar first end region disposed below the jaw mount, a second end region adapted for connection to an electric power line, and a middle region connecting the first and second end regions.

25. A power line connector as set forth in claim 24 wherein said first and second end regions and said middle region are flat and generally co-planar.

26. A power line connector as set forth in claim 24 wherein said middle region is narrower than said first and second end regions.

27. A power line connector as set forth in claim 15 wherein said one-piece structure is a cast metal structure.

28. A power line connector as set forth in claim 27 wherein the cast metal structure further comprises fillets at the junctions of the web and the flanges, said fillets tapering from a relatively smaller size away from the base to a relatively larger size adjacent the base.

* * * * *